United States Patent
Lee et al.

(10) Patent No.: US 12,081,181 B2
(45) Date of Patent: Sep. 3, 2024

(54) VARIABLE-GAIN AMPLIFIERS WITH CONFIGURABLE BALUNS

(71) Applicant: SKYWORKS SOLUTIONS, INC., Irvine, CA (US)

(72) Inventors: Hanseung Lee, Thousand Oaks, CA (US); Dongjin Jung, Thousand Oaks, CA (US); Weimin Sun, Santa Rosa Valley, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 18/315,257

(22) Filed: May 10, 2023

(65) Prior Publication Data

US 2023/0275548 A1    Aug. 31, 2023

Related U.S. Application Data

(63) Continuation of application No. 17/114,394, filed on Dec. 7, 2020, now Pat. No. 11,652,453.

(60) Provisional application No. 62/945,407, filed on Dec. 9, 2019.

(51) Int. Cl.
   *H03F 3/24* (2006.01)
   *H03F 1/02* (2006.01)
   *H03F 3/195* (2006.01)
   *H03F 3/72* (2006.01)

(52) U.S. Cl.
   CPC .......... *H03F 3/245* (2013.01); *H03F 1/0288* (2013.01); *H03F 3/195* (2013.01); *H03F 3/72* (2013.01); *H03F 2200/09* (2013.01); *H03F 2200/451* (2013.01)

(58) Field of Classification Search
   CPC . H03F 3/245; H03F 3/195; H03F 3/72; H03F 1/0288
   USPC .......................................................... 330/51
   See application file for complete search history.

(56) References Cited

U.S. PATENT DOCUMENTS

| | | | |
|---|---|---|---|
| 3,617,920 A * | 11/1971 | Jarvis | H03G 5/025 381/103 |
| 4,999,564 A * | 3/1991 | D'Antonio | H02J 3/24 322/58 |
| 8,493,126 B2 | 7/2013 | Sankaranarayanan et al. | |
| 9,660,606 B2 | 5/2017 | Lyalin et al. | |
| 2010/0248660 A1 | 9/2010 | Bavisi et al. | |
| 2011/0204990 A1 | 8/2011 | Stockstad | |
| 2013/0040586 A1 | 2/2013 | Oliaei et al. | |

(Continued)

OTHER PUBLICATIONS

Non-Final Rejection for U.S. Appl. No. 17/114,394 dated Aug. 18, 2022, 6 pages.

(Continued)

*Primary Examiner* — Patricia T Nguyen
(74) *Attorney, Agent, or Firm* — Chang & Hale LLP

(57) ABSTRACT

Systems, methods, and devices relate to tunable circuits for multimode power amplification. For example, a variable-gain amplification system can include an amplifier configured to provide an amplified signal and to selectively operate in at least a first gain mode and a second gain mode. The variable-gain amplification system can also include a tunable circuit configured to receive the amplified signal from the amplifier and to provide an output signal. The tunable circuit can be configured to implement a first turn ratio for the first gain mode and a second turn ratio for the second gain mode.

18 Claims, 14 Drawing Sheets

(56) References Cited

U.S. PATENT DOCUMENTS

| | | | |
|---|---|---|---|
| 2014/0002189 A1* | 1/2014 | Hsieh | H03F 3/2171 |
| | | | 330/251 |
| 2014/0320252 A1 | 10/2014 | Sun et al. | |
| 2017/0012652 A1 | 1/2017 | Fanori et al. | |
| 2019/0098406 A1* | 3/2019 | Chambon | H03F 3/181 |
| 2019/0165738 A1 | 5/2019 | Pan et al. | |
| 2019/0165739 A1 | 5/2019 | Lyalin et al. | |
| 2019/0334483 A1* | 10/2019 | Balteanu | H03F 1/56 |
| 2020/0169285 A1 | 5/2020 | Malekzadeh et al. | |
| 2020/0336113 A1 | 10/2020 | Pan et al. | |

OTHER PUBLICATIONS

Notice of Allowance for U.S. Appl. No. 17/14,394 dated Jan. 6, 2023, 7 pages.

* cited by examiner

VARIABLE-GAIN AMPLIFIERS WITH CONFIGURABLE BALUNS

CROSS-REFERENCE TO RELATED APPLICATIONS

This application is a continuation of U.S. patent application Ser. No. 17/114,394 (U.S. Pat. No. 11,652,453), filed Dec. 7, 2020, and entitled "Tunable Baluns for Multimode Power Amplification," which claims the benefit of priority to U.S. Provisional Application No. 62/945,407, and entitled "Tunable Balun for Multimode Power Amplification," the entire contents of these are incorporated herein by reference.

BACKGROUND

Field

The present disclosure relates to amplification and balun circuits.

Description of the Related Art

Wireless communication devices are often configured to amplify signals with various levels of power. For example, a wireless communication device can be configured to implement a first gain mode associated with a relatively low amount of amplification and a second gain mode associated with a relatively high amount of amplification. To implement such gain modes, the wireless communication devices include many components to provide different matching networks for different levels of amplification. These components occupy substantial area on the wireless communication devices. For example, a wireless communication device may be required to implement multiple modules for different gain modes.

SUMMARY

In accordance with some implementations, the present disclosure relates to a variable-gain amplification system comprising: a power amplifier configured to provide an amplified signal and to selectively operate in at least a first gain mode and a second gain mode, and a tunable balun circuit configured to receive the amplified signal from the power amplifier and to provide an output signal. The tunable balun circuit is configured to implement a first turn ratio for the first gain mode and a second turn ratio for the second gain mode.

In some embodiments, the tunable balun circuit includes a first coil configured to receive the amplified signal from the power amplifier, a second coil configured to provide the output signal, a first switch coupled between a first portion of the second coil and a second portion of the second coil, and a second switch coupled to a node located between the first portion of the second coil and the second portion of the second coil.

In some embodiments, the power amplifier includes a pair of amplifiers configured to generate a pair of amplified signal components and the first coil of the tunable balun circuit is configured to receive the pair of amplified signal components. The variable-gain amplification system can include a Doherty power amplifier.

In some embodiments, the second switch is coupled between the node and a ground. Further, in some embodiments, the second portion of the second coil includes a first end that is coupled to the first switch and a second end that is coupled to a ground. Moreover, in some embodiments, the first portion of the second coil includes a first end that is coupled to an output node and a second end that is coupled to the node. Furthermore, in some embodiments, the variable-gain amplification system further comprises a first substrate layer, a second substrate layer, and an insulation layer disposed between the first substrate layer and the second substrate layer. The first coil can be disposed on the first substrate layer and the second coil being disposed on the second substrate layer.

In accordance with some implementations, the present disclosure relates to a radio-frequency module comprising: a packaging substrate, a power amplifier implemented on the packaging substrate, and a tunable balun circuit implemented on the packaging substrate. The power amplifier is configured to selectively operate in at least a first gain mode and a second gain mode. The tunable balun circuit is coupled to the power amplifier and configured to implement a first turn ratio for the first gain mode and a second turn ratio for the second gain mode.

In some embodiments, the tunable balun circuit includes a primary coil, a secondary coil coupled to the primary coil, a first switch coupled between a first portion of the secondary coil and a second portion of the secondary coil, and a second switch coupled to a node located between the first portion of the secondary coil and the second portion of the secondary coil.

In some embodiments, the power amplifier includes a pair of amplifiers configured to generate a pair of amplified signal components and the primary coil of the tunable balun circuit is configured to receive the pair of amplified signal components. Further, in some embodiments, the power amplifier and the tunable balun circuit are configured as a Doherty power amplifier. Moreover, in some embodiments, the second switch is coupled between the node and a ground. Furthermore, in some embodiments, the second portion of the secondary coil includes a first end that is coupled to the first switch and a second end that is coupled to a ground. Additionally, in some embodiments, the primary coil includes a first end that is coupled to an output node and a second end that is coupled to the node.

In accordance with some implementations, the present disclosure relates to a radio-frequency device comprising: a power amplifier configured to generate an amplified signal and to selectively operate in at least a first gain mode and a second gain mode, a tunable balun circuit coupled to the power amplifier and configured to provide an output signal, a controller coupled to the tunable balun circuit and configured to provide a control signal to the tunable balun circuit instructing the tunable balun circuit to implement a first turn ratio or a second turn ratio, and an antenna coupled to the tunable balun circuit and configured to receive the output signal. The tunable balun circuit is configured to implement a first turn ratio for the first gain mode and a second turn ratio for the second gain mode.

In some embodiments, the tunable balun circuit includes a primary coil, a secondary coil coupled to the primary coil, a first switch coupled between a first portion of the secondary coil and a second portion of the secondary coil, and a second switch coupled to a node located between the first portion of the secondary coil and the second portion of the secondary coil.

In some embodiments, the power amplifier includes a pair of amplifiers configured to generate a pair of amplified signal components and the primary coil of the tunable balun circuit is configured to receive the pair of amplified signal components. Further, in some embodiments, the second switch is coupled between the node and a ground. Moreover, in some embodiments, the primary coil includes a first end that is coupled to an output node and a second end that is coupled to the node.

In accordance with some implementations, the present disclosure relates to a variable-gain amplification system comprising: an amplifier coupled to an input node and configured to selectively operate in a plurality of gain modes, a primary coil coupled to the amplifier, a secondary coil coupled to an output node and inductively coupled to the primary coil, a first switch coupled to an intermediate node positioned between a first portion of the secondary coil and a second portion of the secondary coil, and a second switch coupled between the first portion of the secondary coil and the second portion of the secondary coil. The first switch is configured to operate based at least in part on a gain mode from among the plurality of gain modes that is selected for operation of the variable-gain amplification system. The second switch is configured to operate based at least in part on the gain mode that is selected for operation of the variable-gain amplification system.

For purposes of summarizing the disclosure, certain aspects, advantages, and/or features of the disclosure have been described. It is to be understood that not necessarily all such advantages may be achieved in accordance with any particular embodiment of the disclosure. Thus, the disclosure may be embodied or carried out in a manner that achieves or optimizes one advantage or group of advantages as taught herein without necessarily achieving other advantages as may be taught or suggested herein.

BRIEF DESCRIPTION OF THE DRAWINGS

Various embodiments are depicted in the accompanying drawings for illustrative purposes and should in no way be interpreted as limiting the scope of the disclosure. In addition, various features of different disclosed embodiments can be combined to form additional embodiments, which are part of this disclosure. Throughout the drawings, reference numbers may be reused to indicate correspondence between reference elements.

DETAILED DESCRIPTION

This disclosure is directed to amplification systems that include tunable baluns to provide a variety of impedance configurations. For example, an amplification system can include an amplifier and a tunable balun circuit coupled to the amplifier. The tunable balun circuit can include a primary coil inductively or magnetically coupled to a secondary coil with the primary coil and/or the secondary coil being configurable for different modes of amplification. In particular, the amplification system can include one or more switches located between one or more turn portions of the primary coil and/or the secondary coil. The one or more switches can be controlled to implement the tunable balun circuit with different turn ratios for different gain modes. The different turn ratios can provide different impedances (e.g., inductances). As such, the amplification systems discussed herein can adapt an impedance to different gain modes to provide efficient transmission/reception capabilities. Further, the amplification systems can conserve space on wireless communication devices, such as by implementing a tunable balun circuit on a single module, which can occupy less area on a radio-frequency device in comparison to other solutions that implement multiple baluns and/or multiple modules.

In embodiments, the amplification systems are discussed in the context of output matching networks, such as with tunable balun circuits being implemented to adjust an output impedance for an amplifier for different gain modes. However, the amplification systems can be implemented in a wide variety of contexts, such as in the context of an input matching network. Further, although many embodiments are discussed in the context of variable-gain amplifiers, the techniques and architectures can be implemented in a wide variety of contexts, such as any type of amplifier or circuit.

Figure 1:
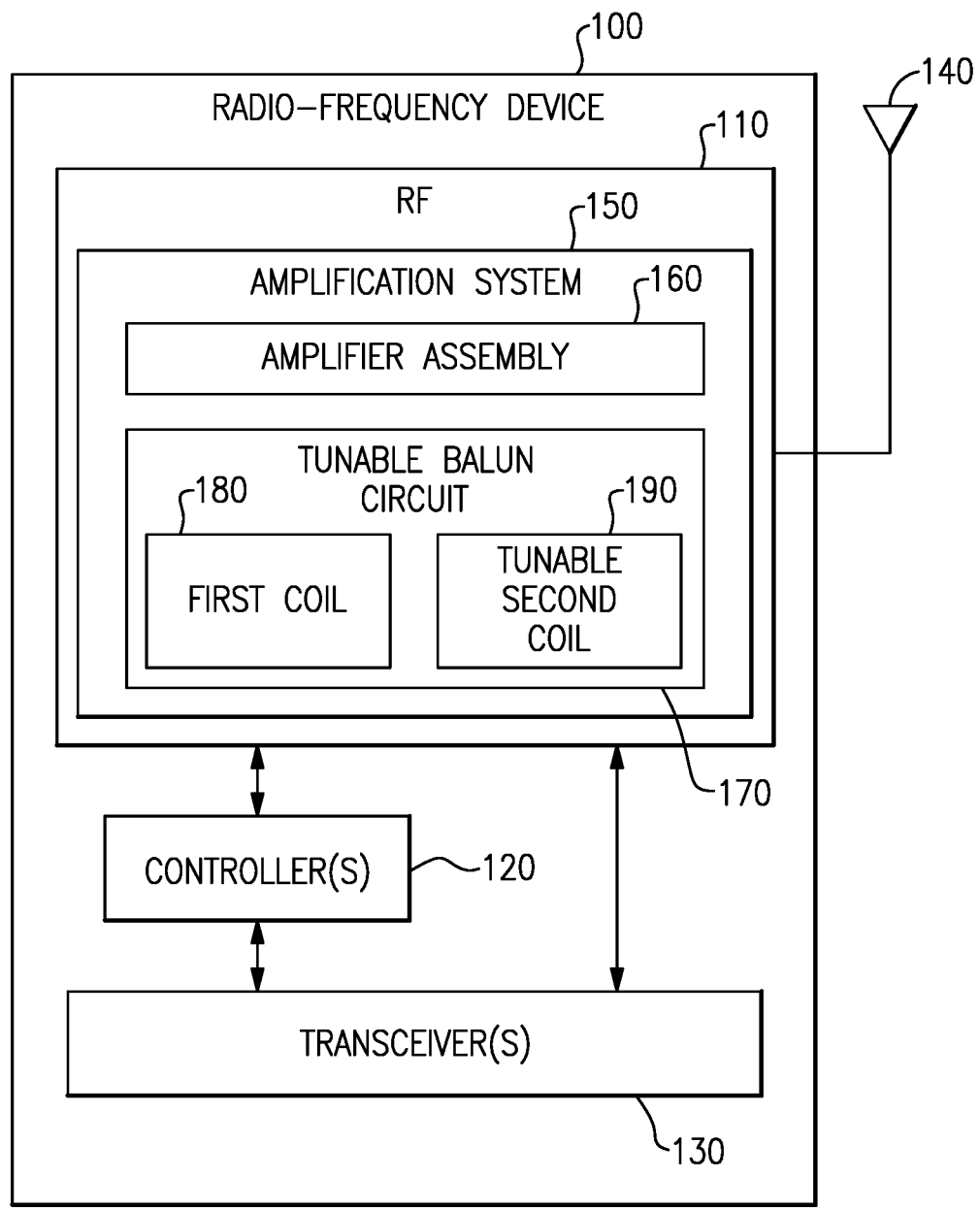
FIG. 1 illustrates an example radio-frequency device having various features relevant to certain aspects of the present disclosure.

FIG. 1 illustrates an example radio-frequency device 100 having various features relevant to certain aspects of the present disclosure. The radio-frequency device 100 includes a radio-frequency (RF) module 110, a controller(s) 120, a transceiver(s) 130, and an antenna(s) 140. The transceiver(s) 130 can be configured to convert between analog signals and digital signals. The transceiver(s) 130 can include a digital-to-analog converter, an analog-to-digital converter, a local oscillator for modulating or demodulating a baseband signal to or from a carrier frequency, a baseband processor that converts between digital samples and data bits (e.g., voice or other types of data), and/or other components. The RF module 110 can perform processing on a signal received from the transceiver 140 and/or received from the antenna(s) 140. In embodiments, the RF module 110 can include or be implemented as a power amplifier module (PAM), a front-end module (FEM), etc. The controller(s) 120 can communicate with the transceiver(s) 130 and/or the RF module 110 to facilitate various functionality discussed herein. Although the controller(s) 120 are illustrated as separate components from the RF module 110, in embodiments the controller(s) 120 are part of the RF module 110.

The RF module 110 can include an amplification system 150 configured to amplify a signal and output the amplified signal. For example, the amplification system 150 can receive a signal from the transceiver(s) 130, the antenna(s) 140, and/or another component of the radio-frequency device 100 and provide an amplified signal to the antenna(s) 140, the transceiver(s) 130, and/or another component of the radio-frequency device 100. The amplification system 150 can include an amplifier assembly 160 and a tunable balun circuit 170 (also referred to as "a matching network"). The amplifier assembly 160, the tunable balun circuit 170, and/or other components discussed herein can be coupled to each other in a variety of manners, such as through a conductive path(s) that can include a cable, a trace, a wire, or any other conductive path/material. Although the amplifier assembly 160 and the tunable balun circuit 170 are illustrated as being implemented on the same RF module 110, one or more of these components can be implemented on separate RF modules. Further, although not illustrated in FIG. 1, the RF module 110 can also include other components, such as attenuators, multiplexers, and so on.

The amplifier assembly 160 can include one or more power amplifiers (PA) and/or one or more low noise amplifiers (LNA) configured to amplify one or more signals. The amplifier assembly 160 can generally be coupled to and/or configured to provide a signal (e.g., an amplified signal) to the tunable balun circuit 170. In embodiments, the amplifier assembly 160 includes at least one pair of amplifiers configured to generate a pair of amplified signals/signal components, as discussed in further detail below. In embodiments, an amplifier (e.g., PA, LNA, etc.) is implemented at least in part with a transistor.

A transistor can be implemented as a single device or multiple devices, such as multiple transistors in a cascoded configuration. A transistor can include a Bipolar junction transistor (BJT) (e.g., an NPN transistor, a PNP transistor, etc.), such as a heterojunction bipolar transistors (HBT), etc. Further, a transistor can include a field-effect transistor (FET) (e.g., N-type or P-type device), such as a junction FET (JFET), insulated gate FET (e.g., a metal-oxide-semiconductor FET (MOSFET), a complementary metal-oxide-semiconductor (CMOS), etc.), and so on.

The tunable balun circuit 170 can be configured to provide input matching and/or output matching functionality. For example, the tunable balun circuit 170 can change an output/input impedance (e.g., inductance) for the amplifier assembly 160. The tunable balun circuit 170 can be configured to receive an amplified signal from the amplifier assembly 160 and provide an output signal to a component of the radio-frequency device 100, such as the antenna(s) 140. The tunable balun circuit 170 can include a first coil 180 and a tunable second coil 190 that are configured to implement different turn ratios for different contexts. In embodiments, the first coil 180 is a primary coil of a balun and the tunable second coil 190 is a secondary coil of the balun. In other embodiments, the first coil 180 is a secondary coil of a balun and the tunable second coil 190 is a primary coil of the balun. Although the tunable balun circuit 170 is discussed in the context of including a single tunable coil (i.e., the tunable second coil 190), the tunable balun circuit 170 can include any number of tunable coils. For example, the first coil 180 and the second coil 190 can both be implemented as tunable coils. Further, the first coil 180 can be a tunable coil instead of the second coil 190.

In embodiments, the radio-frequency device 100 can be configured to implement multiple gain modes. Each gain mode (also referred to as a "power mode") can be associated with a different amount of amplification and/or power. For example, the radio-frequency device 100 (e.g., the amplification system 150) can be configured to operate in a low-gain mode associated with a first amount of amplification/power and operate in a high-gain mode associated with a second amount of amplification/power that is greater than the first amount of amplification/power. In the low-gain mode, the amplifier assembly 160 can amplify an input signal by a first amount of amplification and/or provide an amplified signal associated with a first amount of power, while in the high-gain mode the amplifier assembly 160 can amplify an input signal by a second amount of amplification and/or provide an amplified signal associated with a second amount of power. Although two gain modes are discussed in many embodiments, the radio-frequency device 100 (and/or any other radio-frequency device discussed herein) can implement any number of gain modes. As such, the amplification system 150 (and/or other amplification systems discussed herein) can be configured as a variable-gain amplification system.

In embodiments, a characteristic(s) of the tunable balun circuit 170 can be changed for different gain modes implemented by the radio-frequency device 100. For example, the tunable second coil 190 can be controlled so that the tunable balun circuit 170 provides different turn ratios for different gain modes. To illustrate, the tunable balun circuit 170 can provide a first turn ratio for a first gain mode, a second turn ratio for a second gain mode, and so on. In embodiments, a turn ratio can be defined as (i) the division of the inductance of the tunable second coil 190 by the inductance of the first coil 180 (e.g., $T_{Ratio}=L_{Primary}/L_{Secondary}$), (ii) the division of the number of turns in the tunable second coil 190 (e.g., the number of turns currently being implemented in the tunable second coil 190) by the number of turns in the first coil 180 (e.g., $T_{Ratio}=N_{Primary}/N_{Secondary}$), and/or a variation thereof. In other embodiments, a turn ratio can be defined as (i) the division of the inductance of the first coil 180 by the inductance of the tunable second coil 190 (e.g., $T_{Ratio}=L_{Primary}/L_{Secondary}$), (ii) the division of the number of turns in the first coil 180 by the number of turns in the tunable second coil 190 (e.g., $T_{Ratio}=N_{Primary}/N_{Secondary}$), and/or a variation thereof. In yet further embodiments, a turn ratio can be defined in other manners.

The controller(s) 120 can be configured to manage a mode of operation of the radio-frequency device 100 (e.g., the RF module 110). For example, the radio-frequency device 100 can be configured to implement a plurality of gain modes associated with different amounts of amplification/power. Here, the controller(s) 120 can determine a gain mode to implement and/or send a control signal to the amplifier assembly 160, the tunable balun circuit 170, and/or another component indicative of the gain mode to control the amplifier assembly 160, the tunable balun circuit 170, and/or the other component to implement the gain mode. Further, in embodiments, the controller(s) 120 can determine an impedance and/or turn ratio to implement and/or send a control signal to the tunable balun circuit 170 indicative of the impedance and/or turn ratio to control the tunable balun circuit 170 to implement a particular impedance and/or turn ratio. In embodiments, the controller(s) 120 can provide a control signal in the form of a voltage/current signal (e.g., a biasing signal associated with a particular amount of voltage or current) to control a switch of the tunable balun circuit 170. In embodiments, the controller(s) 120 can include control circuitry configured to implement one or more of the operations discussed herein.

The antenna 150 can include one or more primary antennas and/or one or more diversity antennas. A primary antenna and a diversity antenna can be physically spaced apart such that a signal at the primary antenna and the diversity antenna are received with different characteristics. For example, a primary antenna and a diversity antenna can receive the signal with different attenuation, noise, frequency response, and/or phase shift. In embodiments, the transceiver(s) 130 can use both of the signals with different characteristics to determine data bits corresponding to the signal. In some implementations, the transceiver(s) 130 selects between a primary antenna and a diversity antenna based on the characteristics, such as selecting the antenna with the highest signal-to-noise ratio. In embodiments, the transceiver(s) 130 combines signals from a primary antenna and a diversity antenna to increase the signal-to-noise ratio of the combined signal. In embodiments, the transceiver(s) 130 processes signals to perform multiple-input/multiple-output (MIMO) communication. In embodiments, the diversity antenna can be physically spaced apart from the primary antenna. Here, the diversity antenna can be coupled to the transceiver(s) 130 by a transmission line, such as a cable, a printed circuit board (PCB) trace, or another component. In examples, the transmission line is lossy and/or attenuates the signal received at the diversity antenna before it reaches the transceiver(s) 130.

Figure 2:
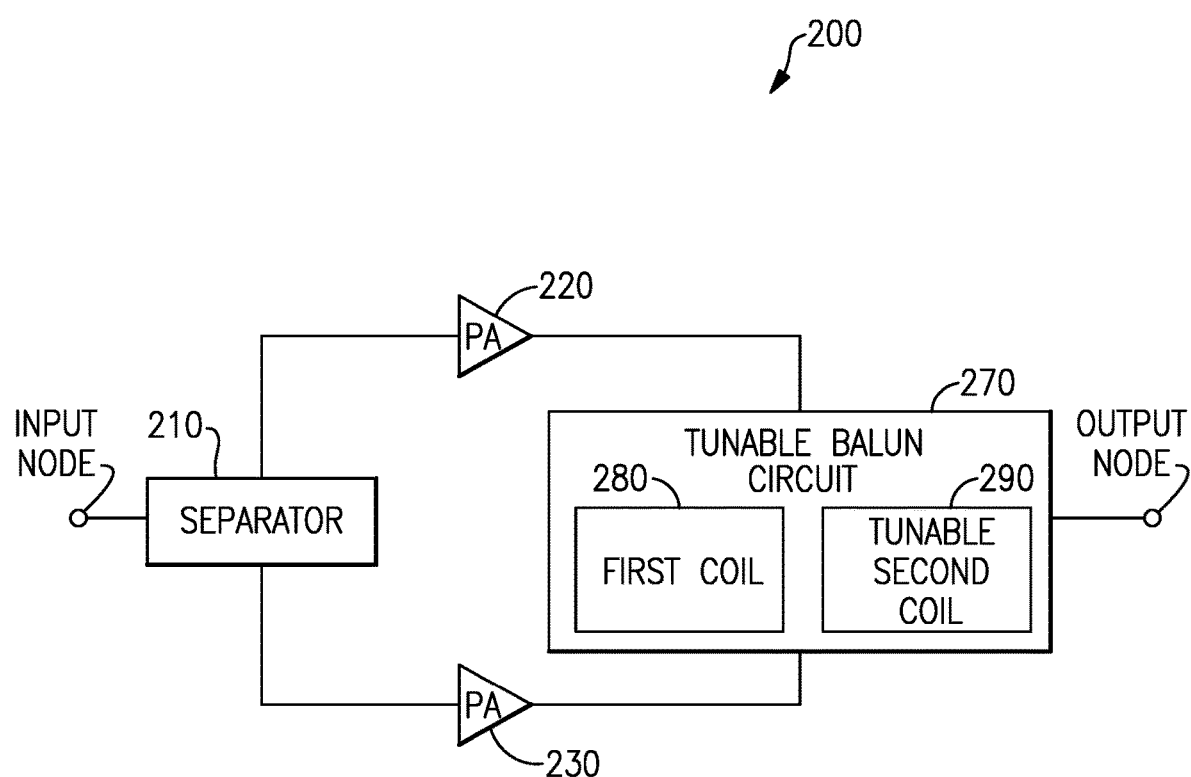
FIG. 2 illustrates an example amplification system that includes a separator, power amplifiers, and a tunable balun circuit in accordance with one or more embodiments.

FIG. 2 illustrates an example amplification system 200 that includes a separator 210, power amplifiers (PAs) 220 and 230, and a tunable balun circuit 270 in accordance with one or more embodiments. FIG. 2 illustrates a non-limiting example in which a tunable balun circuit can be implemented. Here, the amplification system 200 includes two amplification paths with a power amplifier implemented on each amplification path. Although two amplification paths are shown, any number of amplification paths can be implemented. For example, a single amplification path can be used with a single power amplifier. In embodiments, the tunable balun circuit 270 can be the same or similar to the tunable balun circuit 170 of FIG. 1 and/or the PAs 220 and 230 can be the same or similar to the amplifier assembly 160 of FIG. 1.

The separator 210 (also referred to as a "power splitter" or "splitter") can be configured to receive an input signal from an input node and to separate the input signal into multiple signals/signal components. The PA 220 can be configured to receive a first signal/signal component from the separator 210, amplify the first signal/signal component, and provide a first amplified signal/signal component to the tunable balun circuit 270. Similarly, the PA 230 can be configured to receive a second signal/signal component from the separator 210, amplify the second signal/signal component, and provide a second amplified signal/signal component to the tunable balun circuit 270. The first signal/signal component and the second signal/signal component can be associated with the same power/phase or different power/phase. The tunable balun circuit 270 can be configured to receive the first signal/signal component from the PA 220 and the second signal/signal component from the PA 230. In embodiments, the first signal/signal component is provided to a first end of the first coil 280 and the second signal/signal component is provided to a second end of the first coil 280. The tunable balun circuit 270 can be configured to provide an output signal to the output node.

In embodiments, the amplification system 200 is implemented as a Doherty power amplifier with the PAs 220 and 230 representing a pair of power amplifiers. The Doherty power amplifier can provide carrier amplification and peaking amplification of the input signal to yield an amplified output signal. In embodiments, the Doherty power amplifier can be implemented as a symmetrical power amplifier, while in other embodiments the Doherty power amplifier can be implemented as an asymmetrical power amplifier. In the context of a Doherty power amplifier, the separator 210 can split an input signal into a carrier portion and a peaking portion, which can be amplified by the PAs 220 and 230. For example, the PA 220 can amplify a carrier signal component and the PA 230 can amplify a peaking signal component, or vice versa. In embodiments, the tunable balun circuit 270 includes or is implemented as a combiner (also referred to as a "power combiner") that is configured to combine multiple signals/signal components. For example, in the context of a Doherty power amplifier, the tunable balun circuit 270 can be configured to combine an amplified carrier signal component and an amplified peaking signal component and provide an output signal via the output node. Although a Doherty power amplifier is discussed as being implemented in some embodiments, the amplification system 200 can be implemented as a variety of types of amplifiers.

The tunable balun circuit 270 can be configured to provide input matching and/or output matching functionality. For example, the tunable balun circuit 270 can transform impedance for the amplification system 200. The tunable balun circuit 170 can be configured to receive an amplified signal from each of the PAs 220 and 230 and provide an output signal to the output node. The tunable balun circuit 170 can include a first coil 280 and a tunable second coil 290 that are configured to implement different turn ratios for different contexts. The first coil 280 and the tunable second coil 290 can be inductively or magnetically coupled to each other. In embodiments, the tunable balun circuit 270 can be configured to implement different turn ratios for different gain modes.

Figure 3:
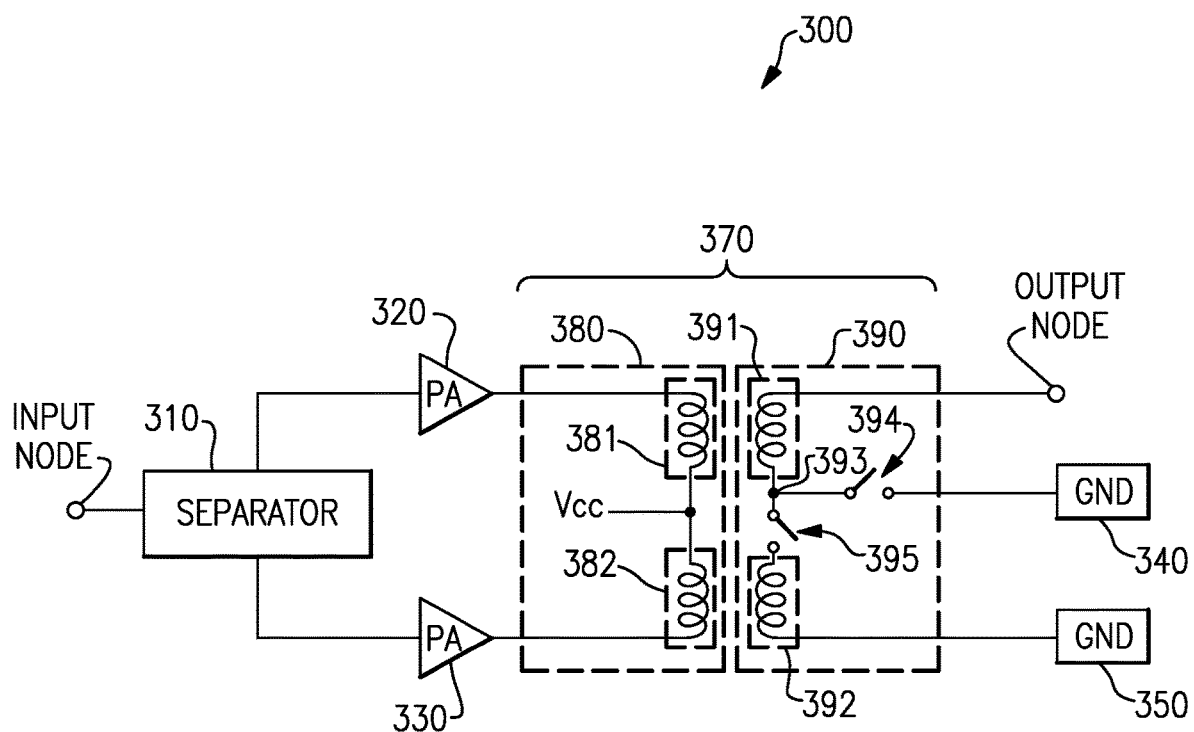
FIG. 3 illustrates details of an example amplification system that includes a separator, power amplifiers, and a tunable balun circuit in accordance with one or more embodiments.

FIG. 3 illustrates details of an example amplification system 300 that includes a separator 310, power amplifiers (PAs) 320 and 330, and a tunable balun circuit 370 in accordance with one or more embodiments. Although two amplification paths are shown in FIG. 3, any number of amplification paths can be implemented. In embodiments, the tunable balun circuit 370 can be the same or similar to the tunable balun circuit 270 of FIG. 2, the PAs 320 and 330 can be the same or similar to the PAs 220 and 230 of FIG. 2, and/or the separator 310 can be the same or similar to the separator 210 of FIG. 2.

The separator 310 is configured to receive an input signal from an input node and separate the signal into multiple signals/signal components. The separator 310 is coupled to the PAs 320 and 330 and configured to provide a first signal/signal component to the PA 320 and a second signal/signal component to the PA 330. The PA 320 is coupled to and configured to provide the first signal/signal component to the tunable balun circuit 370 and the PA 330 is coupled to an configured to provide the second signal/signal component to the tunable balun circuit 370. The tunable balun circuit 370 can be configured to provide an output signal to the output node. In embodiments, the tunable balun circuit 370 can combine the first signal/signal component and the second signal/signal component to provide the output signal.

The tunable balun circuit 370 can include a first coil 380 configured to receive an amplified signal(s) from the PA 320 and/or the PA 330. For example, a first end of the first coil 380 (e.g., a first portion 381 of the first coil 380) can be coupled to the PA 320, while a second end of the first coil 380 (e.g., a second portion 382 of the first coil 380) can be coupled to the PA 330. As shown, the first coil 380 includes the first portion 381 and the second portion 382 with a power supply (i.e., labeled "Vcc") coupled to a node located between the first portion 381 and the second portion 382. In embodiments, the first portion 381 and the second portion 382 of the first coil 380 can include the same characteristics, such as the same number of turns, line thickness/width, inductance, etc. In other embodiments, the first portion 381 and the second portion 382 of the first coil 380 can include different characteristics.

The tunable balun circuit 370 can also include a tunable second coil 390 inductively or magnetically coupled to the first coil 380. The tunable second coil 390 can be configured to receive a signal(s) from the first coil 380 and provide an output signal to the output node. The tunable second coil 390 can include a first portion 391 coupled to a second portion 392 via a switch 395. The first portion 391 of the tunable second coil 390 can include a first end that is coupled to the output node and a second end that is coupled to a node 393 (sometimes referred to as "the intermediate node 393") located between the first portion 391 and the second portion 392. The second portion 392 can include a first end coupled to the node 393 via the switch 395 and a second end coupled to a ground pad 350, which is configured to couple to a ground. A switch 394 is also coupled between the node 393 and a ground pad 340, which is configured to couple to a ground. In embodiments, the first portion 391 and the second portion 392 of the tunable second coil 390 can include the same characteristics, such as the same number of turns, line thickness/width, inductance, etc. In other embodiments, the first portion 391 and the second portion 392 of the tunable second coil 390 can include different characteristics. In embodiments, the switch 394 and/or the switch 395 each include a single pole single throw switch. The switch 394 and/or the switch 395 can each include a transistor(s), a mechanical switch(s), or any other switch, and/or can include any number of throws/poles.

The tunable second coil 390 can be controllable to implement different turn ratios for the tunable balun circuit 370. In particular, the switch 395 and/or the switch 394 can be controlled to enable/disable the second portion 392 of the tunable second coil 390 (and/or the first portion 391 of the tunable second coil 390). In one example, a first turn ratio can be implemented by placing the switch 395 in an ON state (e.g., a conducting/closed state) and placing the switch 394 in an OFF state (e.g., a non-conducting/open state). Here, a conducting path is formed with the first portion 391 of the tunable second coil 391 and the second portion 392 of the tunable second coil 390 between the output node and the ground pad 350. In another example, a second turn ratio can be implemented by placing the switch 395 in an OFF state (e.g., a non-conducting/open state) and placing the switch 394 in an ON state (e.g., a conducting/closed state). Here, a conducting path is formed with the first portion 391 of the tunable second coil 391 between the output node and the ground pad 340.

Figure 4A:
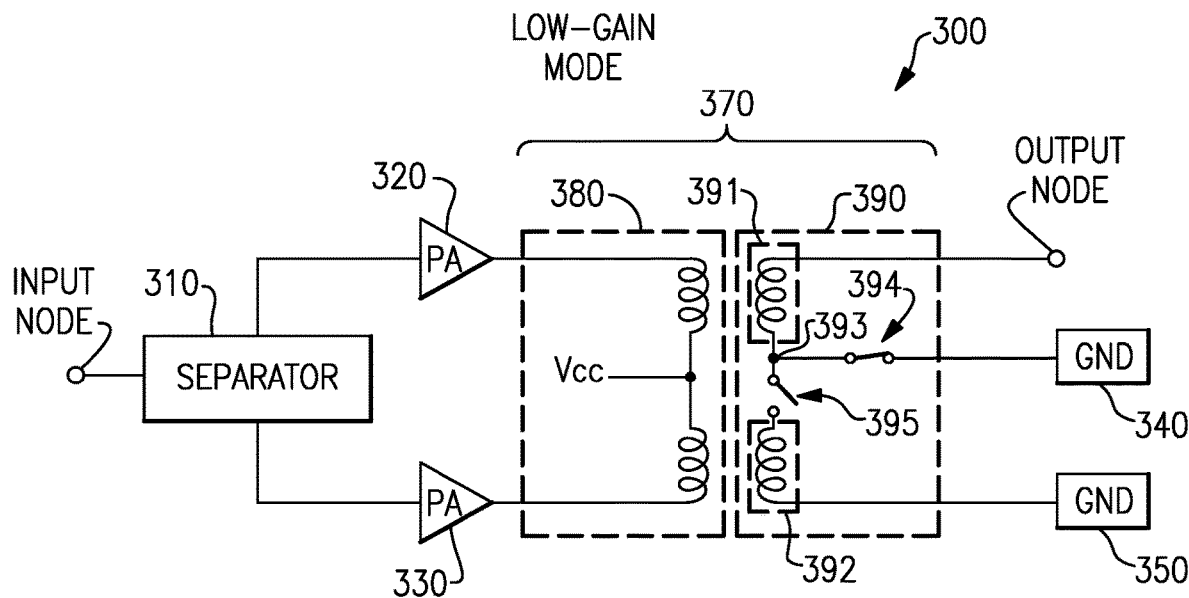
FIGS. 4A and 4B illustrate example configurations of the amplification system of FIG. 3 in accordance with one or more embodiments.
Figure 4B:
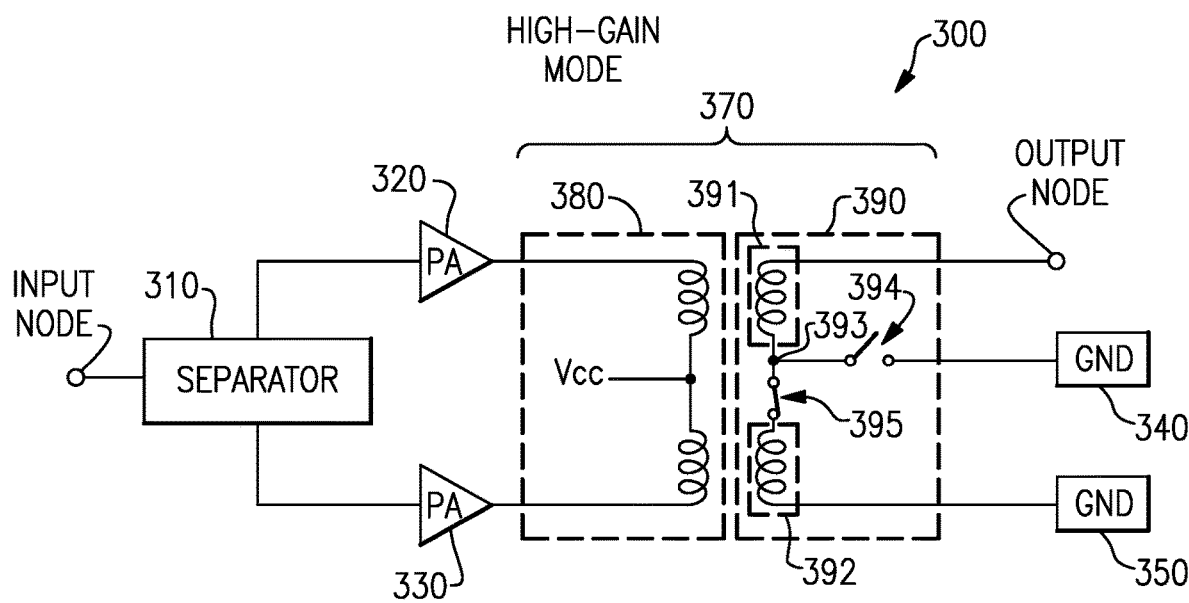

FIGS. 4A and 4B illustrate example configurations of the amplification system 300 of FIG. 3 in accordance with one or more embodiments. In particular, FIG. 4A illustrates the amplification system 300 configured to operate in a low-gain mode, while FIG. 4B illustrates the amplification system 300 configured to operate in a high-gain mode. A high-gain mode is generally associated with more amplification/power than a low-gain mode. In one example, a high-gain mode can be associated with more than a first threshold of amplification/power, while a low-gain mode can be associated with less than the first threshold of amplification/power or less than a second threshold of amplification/power that is less than the first threshold of amplification/power. For instance, a high-gain mode can be associated with more than 20 dB of power delivered to an antenna, while a low gain mode can be associated with less than 20 dB of power delivered to an antenna. For example, in a high-gain mode, a signal associated with 20 or 26.5 dBm of power can be provided to an antenna, while in a low-gain mode, a signal associated with 10 or 5 dBm can be provided to the antenna. Although configurations are illustrated for two gain modes in FIGS. 4A and 4B, any number of gain modes can be implemented with any number of configurations. Further, in embodiments the configuration illustrated for the low-gain mode at FIG. 4A can be used for a high-gain mode and/or the configuration illustrated for the high gain mode at FIG. 4B can be used for a low-gain mode.

In a low-gain mode, as illustrated in FIG. 4A, the switch 394 is set to an ON state and the switch 395 is set to an OFF state. Here, the first portion 391 of the tunable second coil 390 is inductively coupled to the first coil 380. As shown, a conducting path is formed with the output node, the first portion 391 of the tunable second coil 390, the switch 394, and the ground pad 340. By implementing such configuration, the tunable balun circuit 370 can implement a first turn ratio and/or a first inductance (e.g., less inductance for the tunable second coil 390 than in the high-gain mode).

In a high-gain mode, as illustrated in FIG. 4B, the switch 394 is set to an OFF state and the switch 395 is set to an ON state. Here, the first portion 391 and the second portion 392 of the tunable second coil 390 are inductively coupled to the first coil 380. As shown, a conducting path is formed with the output node, the first portion 391 of the tunable second coil 390, the switch 395, the second portion 392 of the tunable second coil 390, and the ground pad 350. By implementing such configuration, the tunable balun circuit 370 can implement a second turn ratio and/or a second inductance (e.g., more inductance for the tunable second coil 390 than in the low-gain mode).

As such, the tunable balun circuit 370 can provide an impedance circuit that adapts to different modes of operation. For example, the tunable balun circuit 370 can provide a first output matching impedance in a low-gain mode (as illustrated in FIG. 4A) and provide a second output matching impedance in a high-gain mode (as illustrated in FIG. 4B). In examples, if a turn ratio of the tunable balun circuit 370 is determined based on the number of turns in a secondary coil (e.g., the tunable second coil 390) over the number of turns in a primary coil (e.g., the first coil 380), the low-gain mode can be associated with a lower turn ratio than the high-gain mode. In embodiments, a controller (not illustrated in FIGS. 4A and 4B) is configured to provide a control signal(s) to the tunable second coil 390 to control a state of the switch 394 and/or the switch 395.

Figure 5:
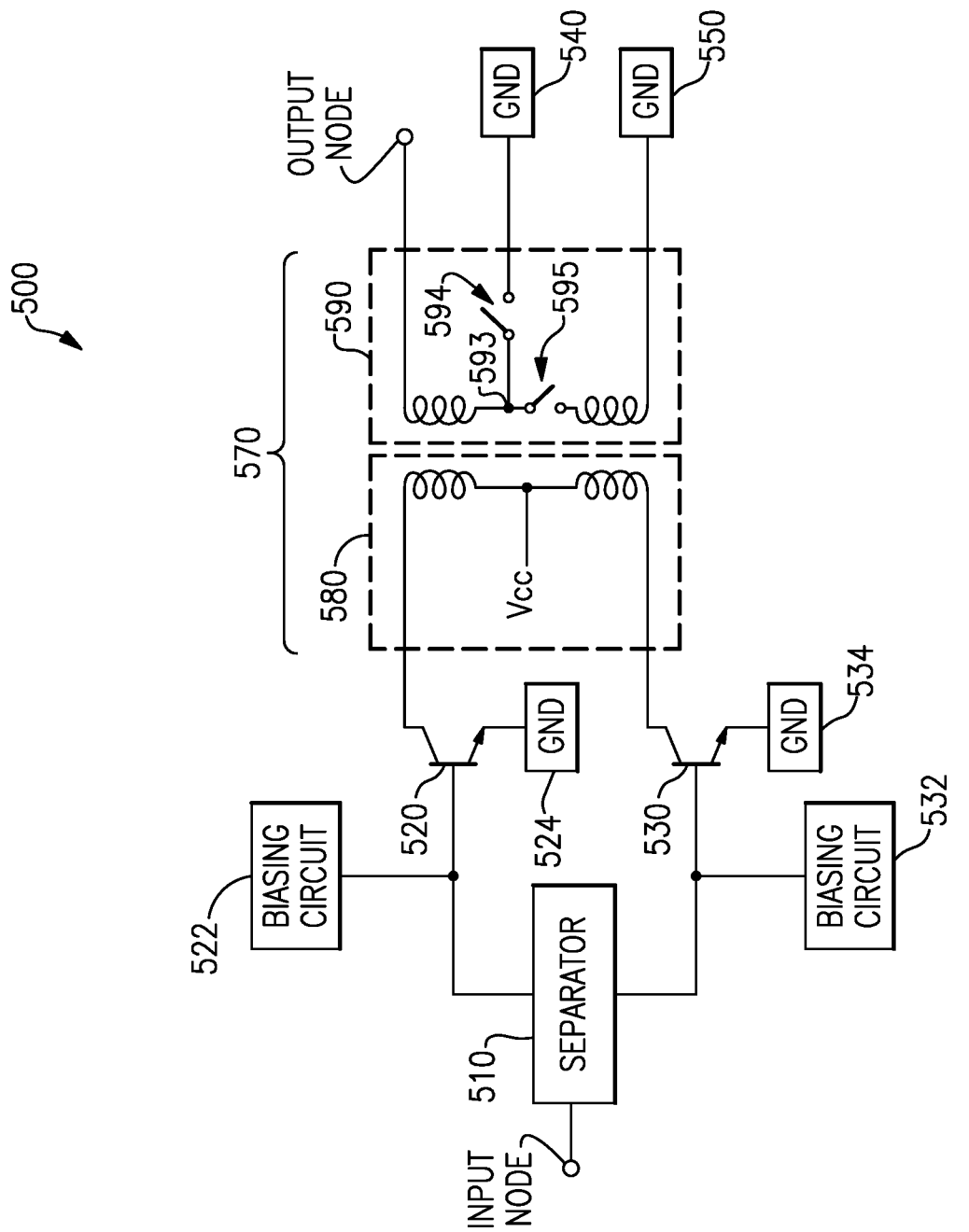
FIG. 5 illustrates an example amplification system that includes transistors implemented as power amplifiers in accordance with one or more embodiments.

FIG. 5 illustrates an example amplification system 500 that includes transistors 520 and 530 implemented as power amplifiers in accordance with one or more embodiments. For example, the transistor 520 can be representative of the PA 320 of FIG. 3 and the transistor 530 can be representative of the PA 330 of FIG. 3. In embodiments, the amplification system 500 can be implemented as a Doherty amplifier that includes two amplification paths, as shown in FIG. 5. However, any number of amplification paths can be implemented. In this example, the transistors 520 and 530 are implemented bipolar junction transistors (BJTs). However, the transistors 520 and 530 can be implemented other types of transistors.

As shown, the amplification system 500 includes a separator 510 configured to receive a signal from an input node and separate the signal into two signals/signal components. The separator 510 can provide a first signal/signal component to a base of the transistor 520 as an input signal/signal component and can provide a second signal/signal component to a base of the transistor 530 as an input signal/signal component. The transistor 520 can be configured to provide an amplified output signal via a collector of the transistor 520, such as to a first coil 580 of a tunable balun circuit 570. An emitter of the transistor 520 can be coupled to a ground pad 524, which is configured to couple to a ground. A biasing circuit 522 can be coupled to the base of the transistor 520 (and/or the collector/emitter of the transistor 520) to provide a signal to bias the transistor 520. Similarly, the transistor 530 can be configured to provide an amplified output signal via a collector of the transistor 530, such as to the first coil 580 of the tunable balun circuit 570. An emitter of the transistor 530 is coupled to a ground pad 534, which is configured to couple to a ground. A biasing circuit 532 can be coupled to the base of the transistor 530 (and/or the collector/emitter of the transistor 530) to provide a signal to bias the transistor 530.

As also shown, the tunable balun circuit 570 of the amplification system 500 includes a tunable second coil 590 configured to inductively coupled to the first coil 580. The tunable second coil 590 includes a first upper coil coupled between the output node and a node 593 and a second lower coil coupled between a switch 595 and a ground pad 550. The tunable balun circuit 570 also includes a switch 594 coupled between the node 593 and a ground pad 540. As similarly discussed in other contexts, the switch 594 and/or the switch 595 can be controllable to adjust a turn ratio of the tunable balun circuit 570 (e.g., adjust an inductance).

Figure 6:
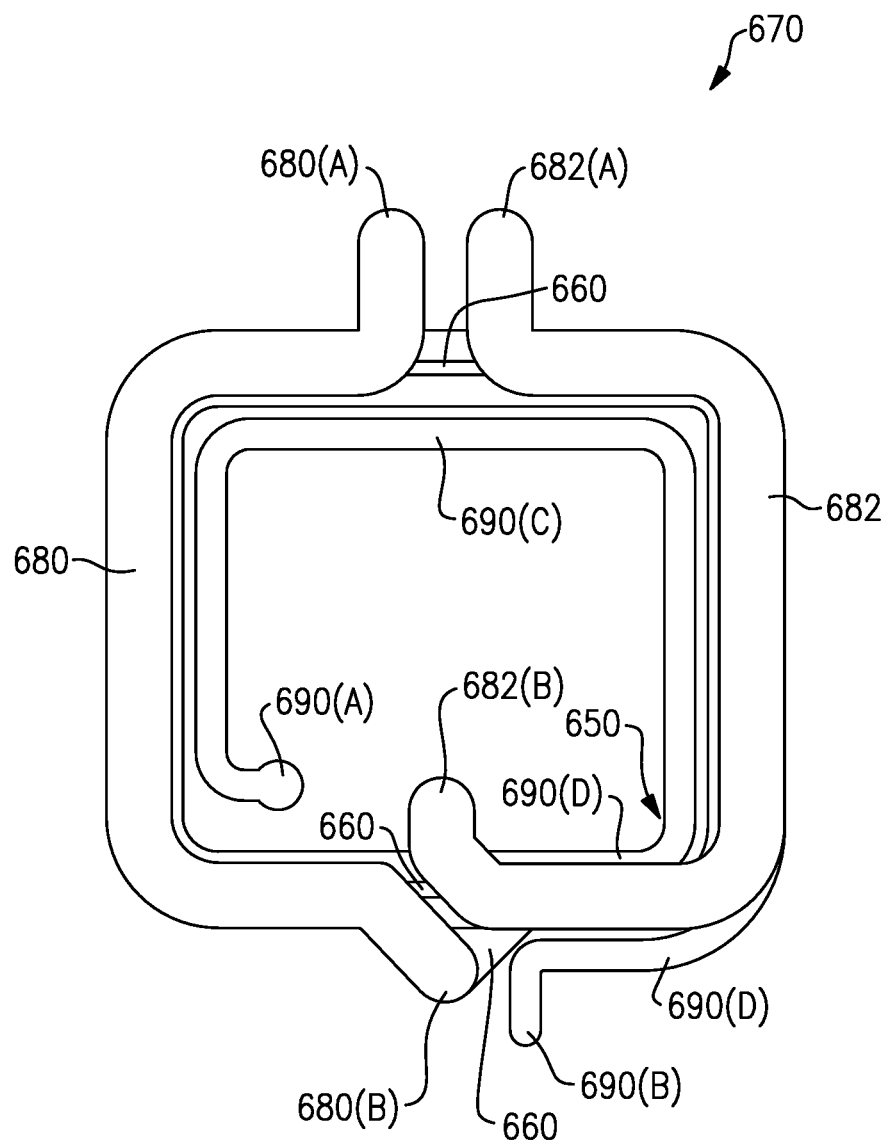
FIG. 6 illustrates an example schematic diagram of a tunable balun circuit in accordance with one or more embodiments.

FIG. 6 illustrates an example schematic diagram of a tunable balun circuit 670 in accordance with one or more embodiments. The tunable balun circuit 670 includes a primary coil 680/682 (also referred to as "the first conductive coil 680/682") and a secondary coil 690 (also referred to as "the second conductive coil 690") implemented on different layers of a device/substrate. As shown, the primary coil 680/682 is overlaid over at least a portion of the secondary coil 690 to magnetically or inductively coupled to the secondary coil 690. The primary coil 680/682 and/or the secondary coil 690 can be formed of a variety of conductive materials and/or formed in a variety of manners on a device/substrate. In embodiments, the primary coil 680/62 and/or the secondary coil 690 (and/or other coils discussed herein) are implemented as one or more turns of a metal trace formed on a surface/layer of a substrate, such as a die substrate.

The primary coil 680/682 includes a first portion 680 and a second portion 682 that are coupled together. The first portion 680 of the primary coil 680/682 includes a first port 680(A) (also referred to as "the first terminal 680(A)") and a second port 680(B) (also referred to as "the second terminal 680(B)"). Similarly, the second portion 682 of the primary coil 680/682 includes a first port 682(A) (also referred to as "the first terminal 682(A)") and a second port 682(B) (also referred to as "the second terminal 682(B)"). The second port 680(B) of the first portion 680 can couple to the second port 682(B) of the second portion 682, such as through one or more vias or other conductive paths that travel around the secondary coil 690. As such, the primary coil 680/682 connects the first port 680(A) of the first portion 680 to the first port 682(A) of the second portion 682. The primary coil 680/682 can include any number of turns. In embodiments, the first port 680(A) of the first portion 680 and the first port 682(A) of the second portion 682 correspond to input ports.

The secondary coil 690 includes a first port 690(A) (also referred to as "the first terminal 690(A)") and a second port 690(B) (also referred to as "the second terminal 690(B)"). In embodiments, the first port 690(A) of the secondary coil 690 corresponds to an output port and/or the second port 690(B) of the secondary coil 690 is configured to couple to a ground. In other embodiments, the second port 690(B) of the secondary coil 690 corresponds to an output port and/or the first port 690(A) of the secondary coil 690 is configured to couple to a ground. The first port 690(A) and the second port 690(B) can be coupled to each other through a switch with one or more turns implemented in between the first port 690(A) and the second port 690(B). The secondary coil 690 can include any number of turns.

In embodiments, the tunable balun circuit 670 can include one or more switches to implemented different turn ratios. For example, a first switch can be implemented at a location 650 between the portion 690(C) and the portion 690(D) of the secondary coil 690 to selectively couple/decouple the portion 690(C) from the portion 690(D). In some instances, the first switch can include the switch 395 of FIG. 3. Additionally, or alternatively, a second switch can be implemented at the location 650 to selectively couple/decouple the portion 690(C) to a ground and bypass the portion 690(D). In some instances, the second switch can include the switch 394 of FIG. 3. The first switch and/or the second switch can be implemented on any layer of a device/substrate, such as a lower layer of the device/substrate, a same layer as the primary coil 680/682, a same layer as the secondary coil 690, a combination thereof, and so on.

In embodiments, the tunable balun circuit 670 is implemented with coils on three separate layers of a device/substrate (sometimes referred to as a "3-layer laminate balun"). For example, the primary coil 680/682 can be coupled to an additional coil 660 that is implemented on an additional layer of a device/substrate (e.g., coil layer 3). Here, the additional coil 660 can form part of the primary coil 680/682. In this example, the second port 680(B) of the primary coil 680 can couple to a first end of the additional coil 660 through a first via, and the second port 682(B) of the primary coil 682 can couple to a second end of the additional coil 660 through a second via. The first via and/or the second via can be implemented through multiple layers of the device/substrate. The additional coil 660 can form one or more turns on the additional layer. In this example, the additional coil 660 and the primary coil 680/682 sandwich the secondary coil 690 (e.g., the secondary coil 690 is disposed between the additional coil 660 and the primary coil 680/682).

Further, in other embodiments, the tunable balun circuit 670 is implemented with coils on two separate layers of a device/substrate (sometimes referred to as a "2-layer laminate balun"). For example, the additional coil 660 can be eliminated and the primary coil 680/682 can be implemented with a via or another conductive path to couple the second port 680(B) to the second port 682(B). Here, the via or other conductive path can travel down through one or more layers and then back up through the one or more layers to travel around the secondary coil 690.

Although many embodiments are discussed in the context of the tunable balun circuit 670 being implemented with coils located on two or three layers of a device/substrate, the tunable balun circuit 670 can be implemented on any number of layers of the device/substrate. In yet another embodiment, the tunable balun circuit 670 can be implemented with a co-planar configuration with the primary coil 680/682 and the secondary coil 690 disposed in the same layer.

In the example of FIG. 6, the primary coil 680/682 and the secondary coil 690 are illustrated with particular characteristics. For example, the primary coil 680/682 is shown with a larger width than the secondary coil 690. However, the primary coil 680/682 and the secondary coil 690 can have a variety of characteristics that are the same or different, such as the same or different widths, thicknesses, lengths, shapes, diameters, and so on.

In embodiments, the tunable balun circuit 670 includes a relatively compact layout. For example, the tunable balun circuit 670 can be configured to occupy substantially less area than other solutions. To illustrate, the tunable balun circuit 670 can be implemented on a single module, such as a single radio-frequency module.

Figure 7:
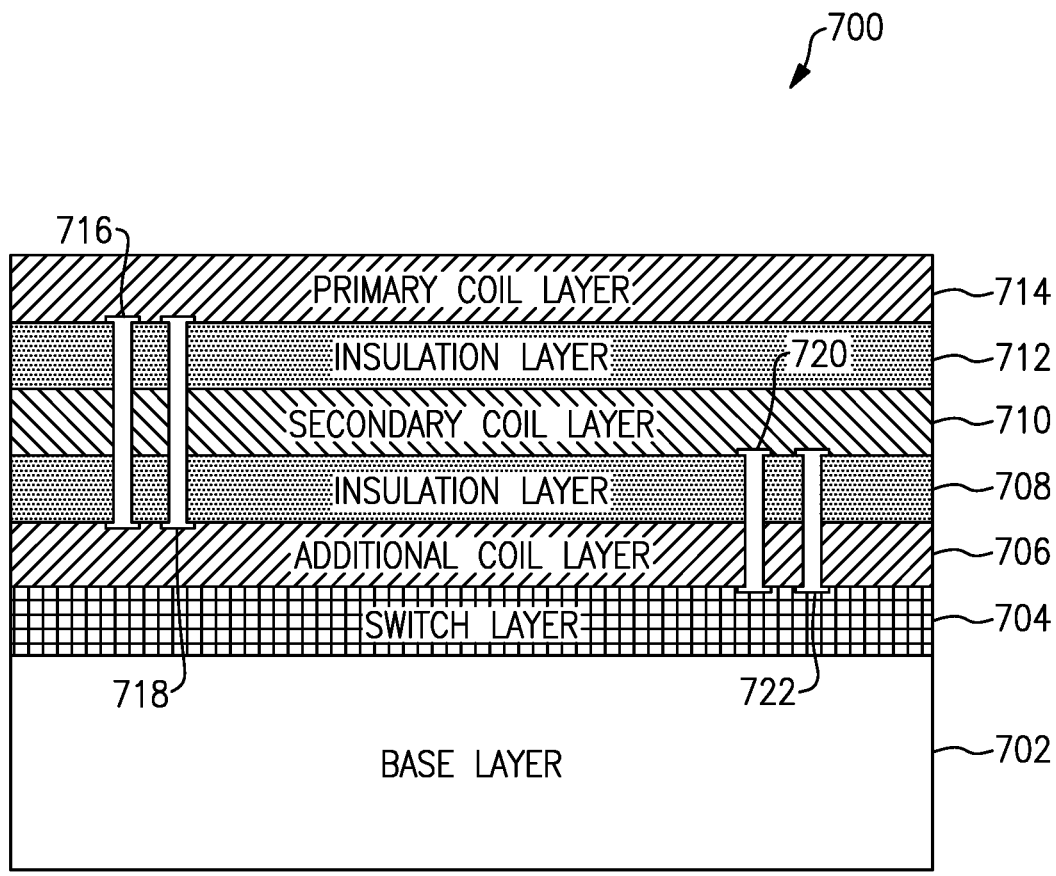
FIG. 7 illustrates an example sectional view of a portion of a device/substrate that implements a tunable balun circuit in accordance with one or more embodiments.

FIG. 7 illustrates an example sectional view of a portion of a device/substrate 700 that implements a tunable balun circuit in accordance with one or more embodiments. In particular, FIG. 7 shows various layers of a device/substrate in which various coils can be implemented. The layers are shown in a particular arrangement as one of many example embodiments that can be implemented. As such, in other embodiments the layers can be arranged in a different configuration.

In this example, the device 700 includes a base layer 702, a switch layer 704 disposed on the base layer 702, an additional coil layer 706 disposed on the switch layer 704, an insulation layer 708 disposed on the additional coil layer 706, a secondary coil layer 710 disposed on the insulation layer 708, an insulation layer 712 disposed on the secondary coil layer 710, and a primary coil layer 714 disposed on the insulation layer 712. In some instances, a layer can be referred to as a substrate layer. The primary coil layer 714 can include a primary coil of a tunable balun circuit, the secondary coil layer 710 can include a secondary coil of the tunable balun circuit, and the additional coil layer 706 can include an additional coil that is configured to couple to the primary coil. The additional coil can form part of the primary coil.

The device 700 also includes conductive vias 716 and 718 to provide conductive paths between the primary coil layer 714 and the additional coil layer 706. For example, the via 716 can connect a first end of a primary coil implemented on the primary coil layer 714 to a first end of an additional coil implemented on the additional coil layer 706. Further, the via 718 can couple a second end of the additional coil implemented on the additional coil layer 706 to a second end of the primary coil implemented on the primary coil layer 714.

Moreover, the device 700 also includes vias 720 and 722 to provide conductive paths between the secondary coil layer 710 and the switch layer 704. For example, the switch layer 704 can implement one or more switches that are controllable to change a number of turns of a secondary coil implemented on the secondary coil layer 710. To illustrate, the via 720 can connect a first portion of the secondary coil implemented on the secondary coil layer 710 to a first end of a first switch implemented on the switch layer 704, and the via 722 can connect a second end of the first switch to a second portion of the secondary coil. As such, the first switch can couple/decouple the first portion of the secondary coil to the second portion of the secondary coil. In embodiments, the switch layer 704 also includes a second switch connected to a ground layer and a node located between the first portion of the secondary coil and the second portion of the secondary coil. For example, the second switch can be connected to the via 720 (and/or the via 722).

Figure 8A:
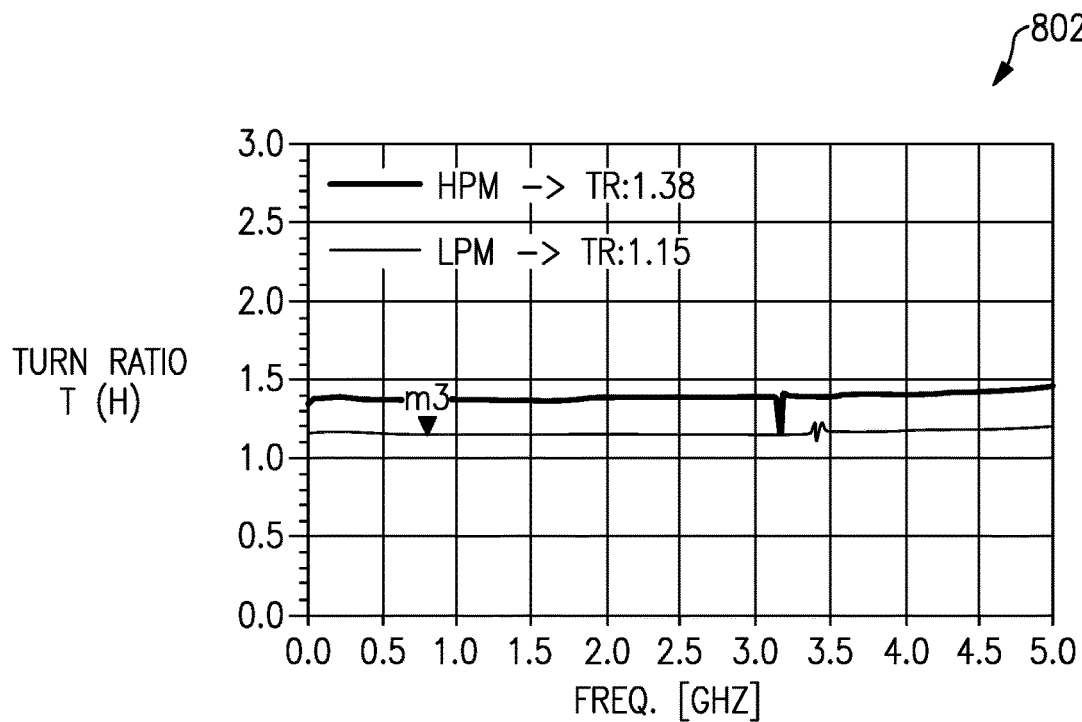
FIGS. 8A and 8B illustrate example graphs for a tunable balun circuit in accordance with one or more embodiments.
Figure 8B:
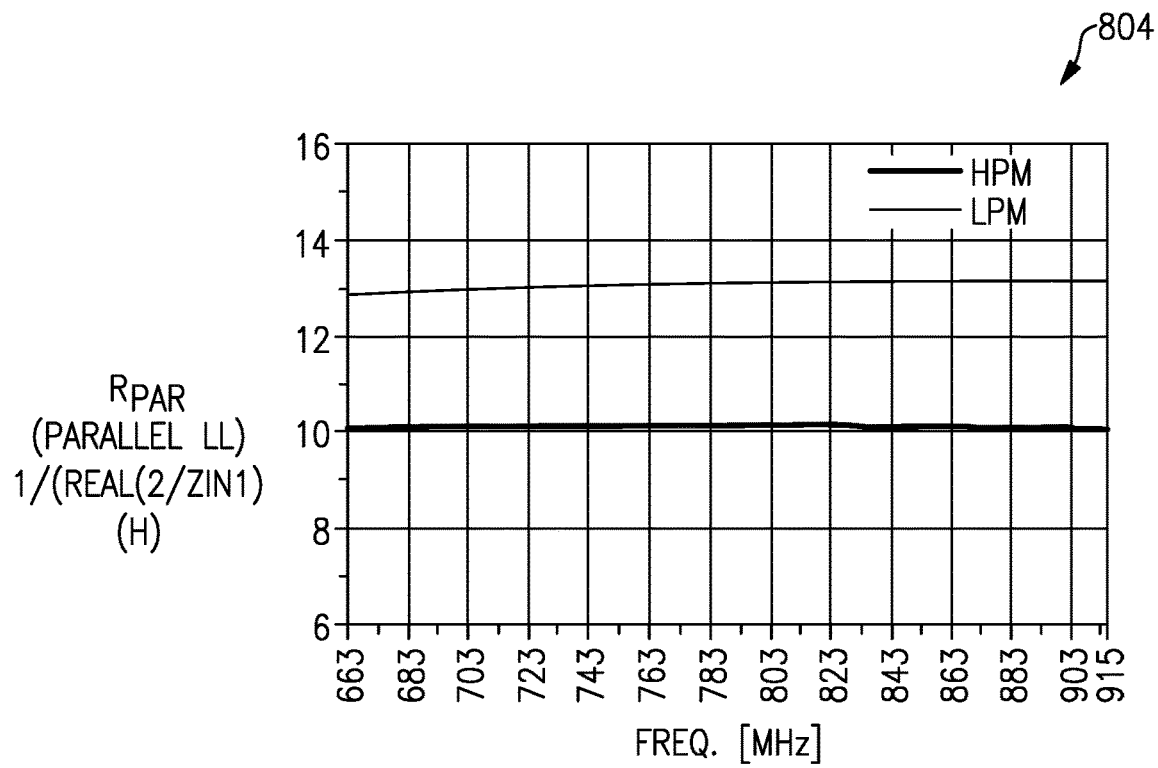

FIGS. 8A and 8B illustrate example graphs 802 and 804 for a tunable balun circuit in accordance with one or more embodiments. For example, the graphs 802 and 804 can provide data for any of the tunable balun circuits discussed herein. As shown in FIG. 8A, the graph 802 shows data for a turn ratio (labeled as "T") with respect to frequency in GHz for a high-power mode (HPM) (also referred to as a "high-gain mode") and a low-power mode (LPM) (also referred to as a "low-gain mode"). The HPM has a turn ratio of about 1.38 over various frequencies, while the LPM has a turn ratio of about 1.15 over various frequencies. As shown in FIG. 8B, the graph 804 shows data for the real part of the impedance in ohms (labeled "Rpar") with respect to frequency in MHz for a HPM and a LPM. H indicates that the data for the graphs 802 and 804 is over history (e.g., multiple simulations, measurements, etc.).

FIGS. 9A-9F illustrate example graphs 902-912 for a tunable balun circuit in accordance with one or more embodiments. For example, the graphs 902-912 can provide data for any of the tunable balun circuits discussed herein. In each of the graphs 902-912, one line represents a high-power mode (HPM) (also referred to as a "high-gain mode") and one line represents a low-power mode (LPM) (also referred to as a "low-gain mode"). Further, H indicates that the data for the graphs 902-912 is over history (e.g., multiple simulations, measurements, etc.).

Figure 9A:
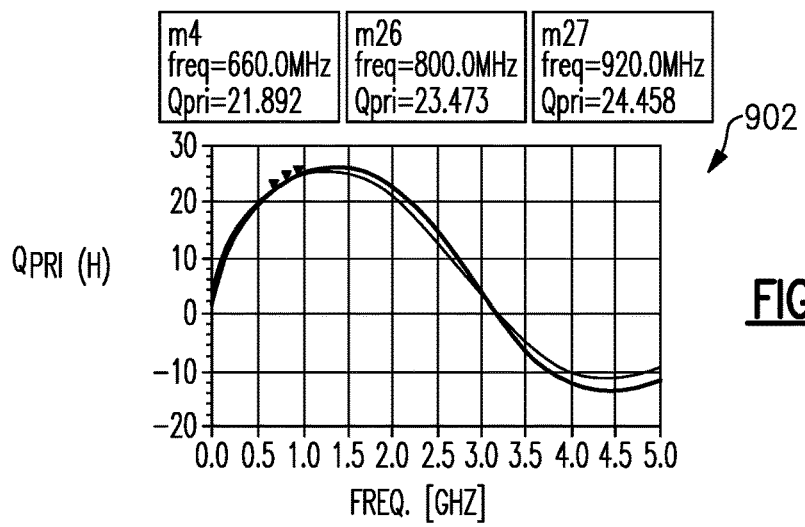
FIGS. 9A-9F illustrate example graphs for a tunable balun circuit in accordance with one or more embodiments.
Figure 9B:
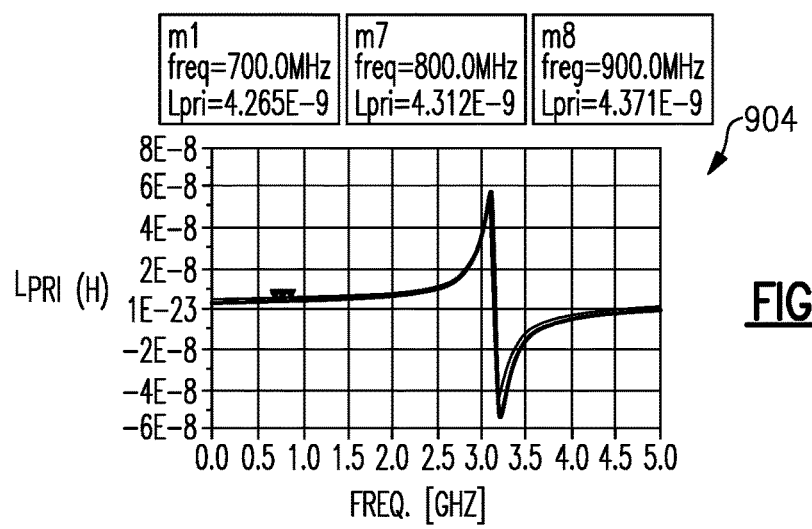
Figure 9C:
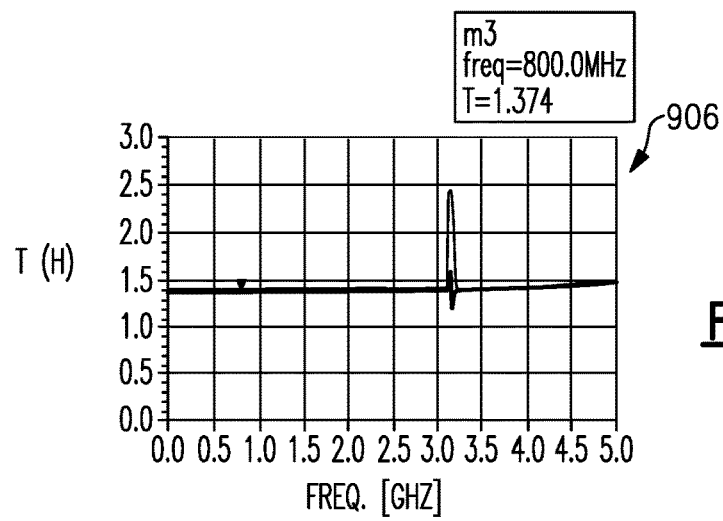
Figure 9D:
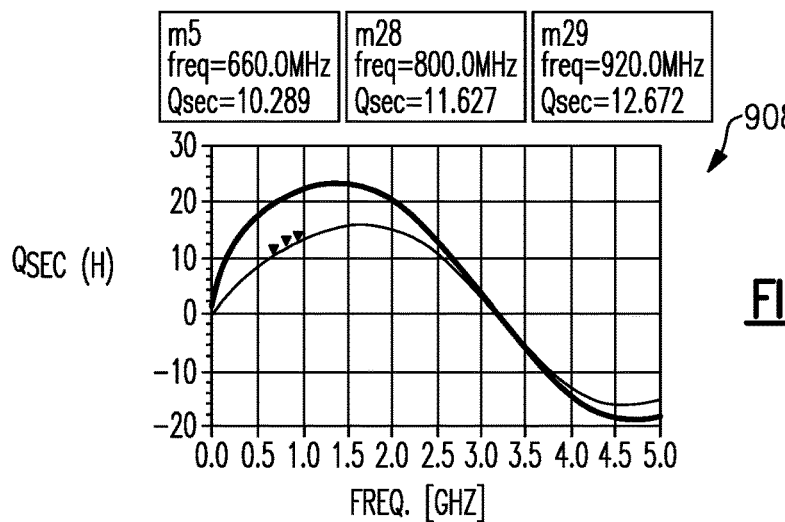
Figure 9E:
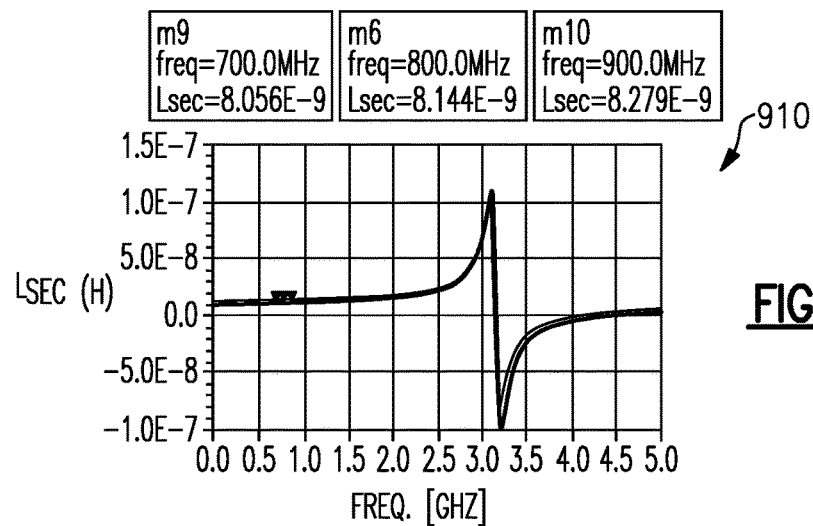
Figure 9F:
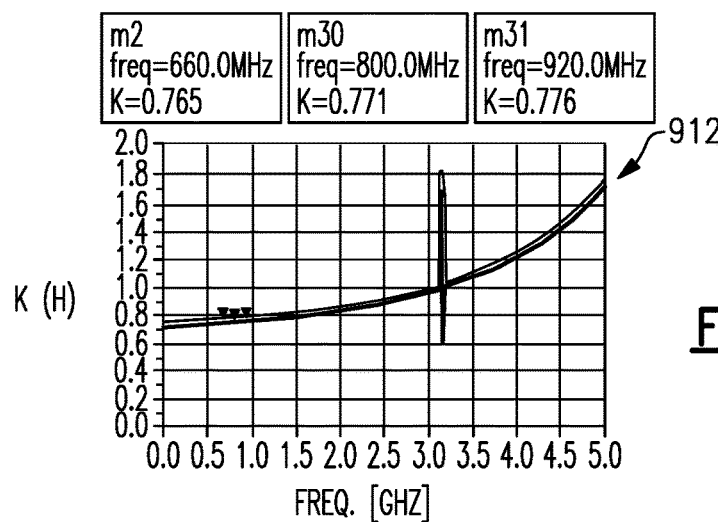

In FIG. 9A, the graph 902 shows data for a quality factor of a primary coil (labeled as "Qpri") with respect to frequency in GHz for a HPM and a LPM. In FIG. 9B, the graph 904 shows data for an inductance of a primary coil with respect to frequency in GHz for a HPM and a LPM. In FIG. 9C, the graph 906 shows data for a turn ratio (labeled as "T") with respect to frequency in GHz for a HPM and a LPM. In FIG. 9D, the graph 908 shows data for a quality factor of a secondary coil (labeled as "Qsec") with respect to frequency in GHz for a HPM and a LPM. In FIG. 9E, the graph 910 shows data for an inductance of a secondary coil with respect to frequency in GHz for a HPM and a LPM. In FIG. 9F, the graph 912 shows data for a coupling coefficient (labeled as "K") with respect to frequency in GHz for a HPM and a LPM.

Figure 10:
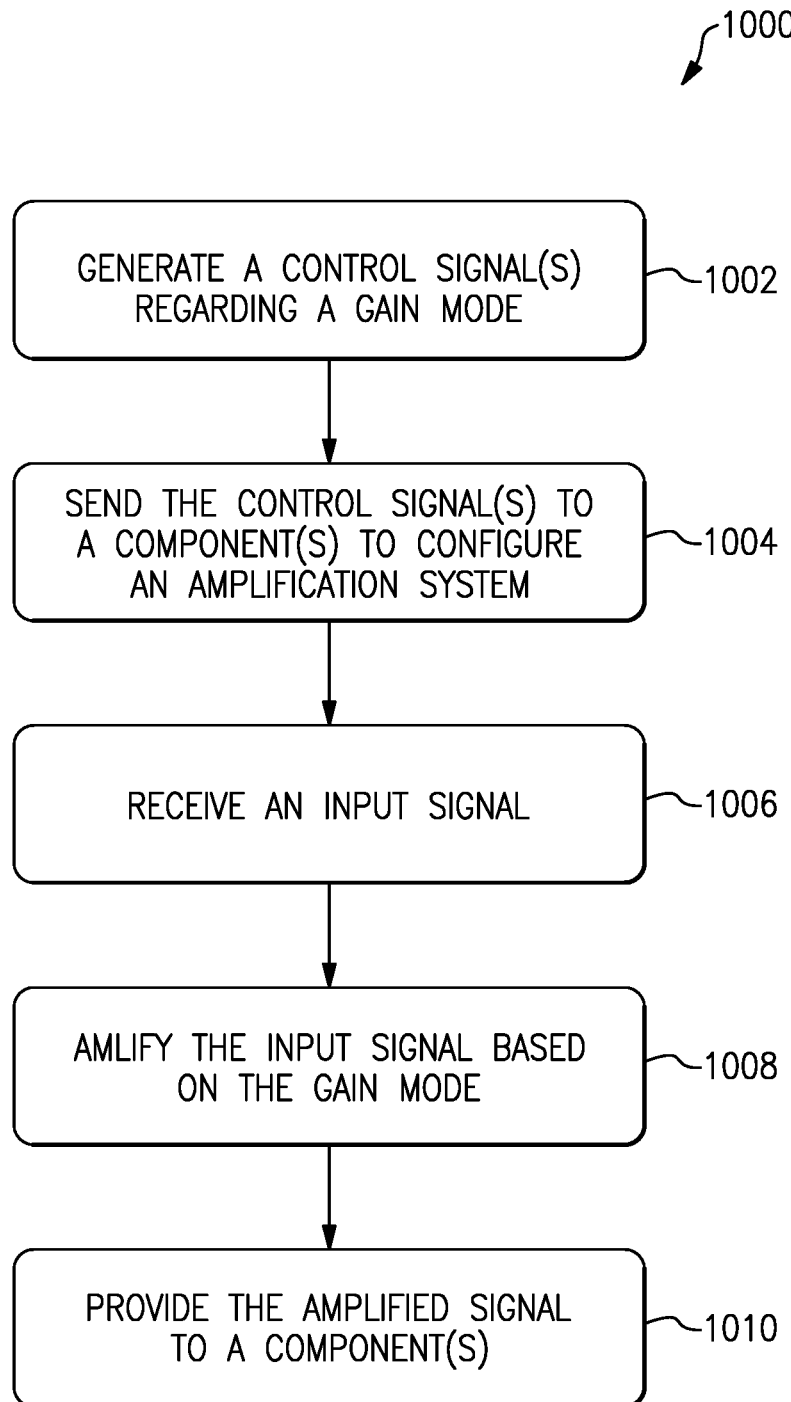
FIG. 10 illustrates an example flow diagram of a process of controlling an amplification system in accordance with one or more embodiments.

FIG. 10 illustrates an example flow diagram of a process 1000 of controlling an amplification system in accordance with one or more embodiments. The process 1000 can be implemented by any of the components of the radio-frequency devices discussed herein.

At block 1002, a control signal(s) regarding a gain mode can be generated. For example, a controller can generate a control signal regarding and/or indicating a gain mode, an impedance, and/or a turn ratio to implement.

At block 1004, the control signal(s) can be sent to one or more components to configure an amplification system. For example, a controller can send a control signal to a tunable balun circuit, an amplifier, and/or a supply voltage component to configure the tunable balun circuit, the amplifier, and/or the supply voltage component for a gain mode that is selected for operation. The control signal can configure a component of the variable-gain amplifier by setting a supply voltage, controlling a switch(s) of the tunable balun circuit to an ON or OFF state to configure a turn ratio, etc. As such, a tunable balun circuit can be configured to provide a tailored amount of inductance for a gain mode.

At block 1006, an input signal can be received. For example, an amplification system can receive a signal from a transceiver. Alternatively, or additionally, an amplification system can receive a signal from an antenna or another component of a radio-frequency device.

At block 1008, the input signal can be amplified based on the gain mode. For example, an amplification system that is configured for the gain mode, such as with a tailored tunable balun circuit, can amplify the input signal with an amplification amount and/or to a power level that is associated with the gain mode.

At block 1010, the amplified signal can be provided to one or more components. For example, an amplification system can provide an amplified signal as an output signal to one or more components of a radio-frequency device associated with the amplification system. For instance, the amplified signal can be provided to an antenna of the radio-frequency device, a transceiver of the radio-frequency device, and so on.

FIGS. 11A-11E illustrate non-limiting example power amplifier (PA) configurations in accordance with one or more embodiments. In embodiments, any of the power amplifiers discussed herein can be implemented in a configuration shown in FIGS. 11A-11E.

Figure 11A:
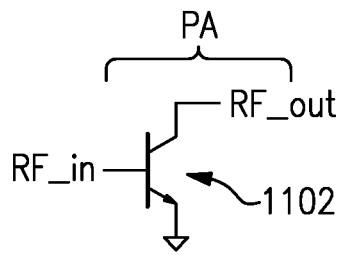
FIGS. 11A-11E illustrate non-limiting example power amplifier configurations in accordance with one or more embodiments.

FIG. 11A shows an example PA having an amplifying transistor 1102, where an input RF signal (RF_in) is provided to a base of the transistor 1102, and an amplified RF signal (RF_out) is output through a collector of the transistor 1102.

Figure 11B:
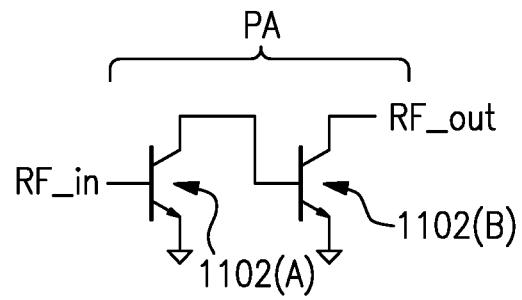

FIG. 11B shows an example PA having a plurality of amplifying transistors (e.g., 1102(A), 1102(B)) arranged in stages. An input RF signal (RF_in) is provided to a base of the first transistor 1102(A), and an amplified RF signal from the first transistor 1102(A) is output through its collector. The amplified RF signal from the first transistor 1102(A) is provided to a base of the second transistor 1102(B), and an amplified RF signal from the second transistor 1102(B) is output through its collector to thereby yield an output RF signal (RF_out) of the PA.

Figure 11C:
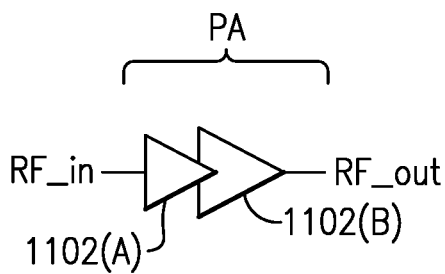

In some embodiments, the foregoing example PA configuration of FIG. 11B can be depicted as two or more stages, as shown in FIG. 11C. The first stage 1102(A) can be configured as, for example, a driver stage; and the second stage 1102(B) can be configured as, for example, an output stage.

Figure 11D:
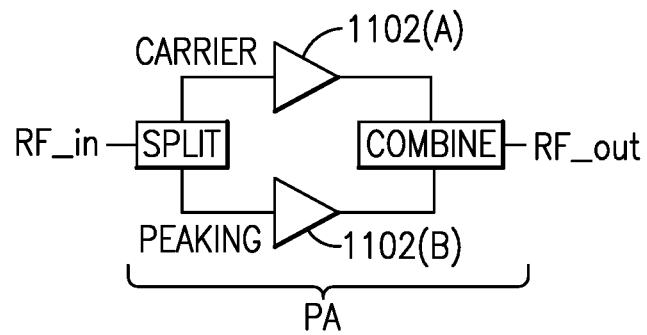

FIG. 11D shows that in some embodiments, a PA can be configured as a Doherty PA. Such a Doherty PA can include amplifying transistors 1102(A) and 1102(B) configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

Figure 11E:
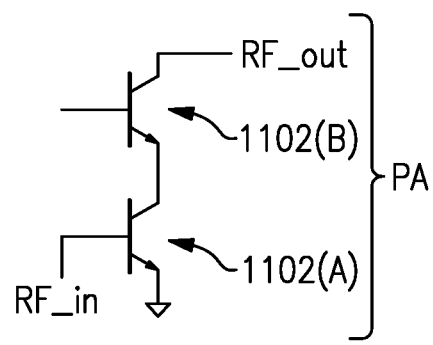

FIG. 11E shows that in some embodiments, a PA can be implemented in a cascode configuration. An input RF signal (RF_in) can be provided to a base of the first amplifying transistor 1102(A) operated as a common emitter device. The output of the first amplifying transistor 1102(A) can be provided through its collector and be provided to an emitter of the second amplifying transistor 1102(B) operated as a common base device. The output of the second amplifying transistor 1102(B) can be provided through its collector so as to yield an amplified output RF signal (RF_out) of the PA.

In the various examples of FIGS. 11A-11E, the amplifying transistors are described as bipolar junction transistors (BJTs), such as heterojunction bipolar transistors (HBTs). It will be understood that one or more features of the present disclosure can also be implemented in or with other types of transistors, such as field-effect transistors (FETs).

Figure 12:
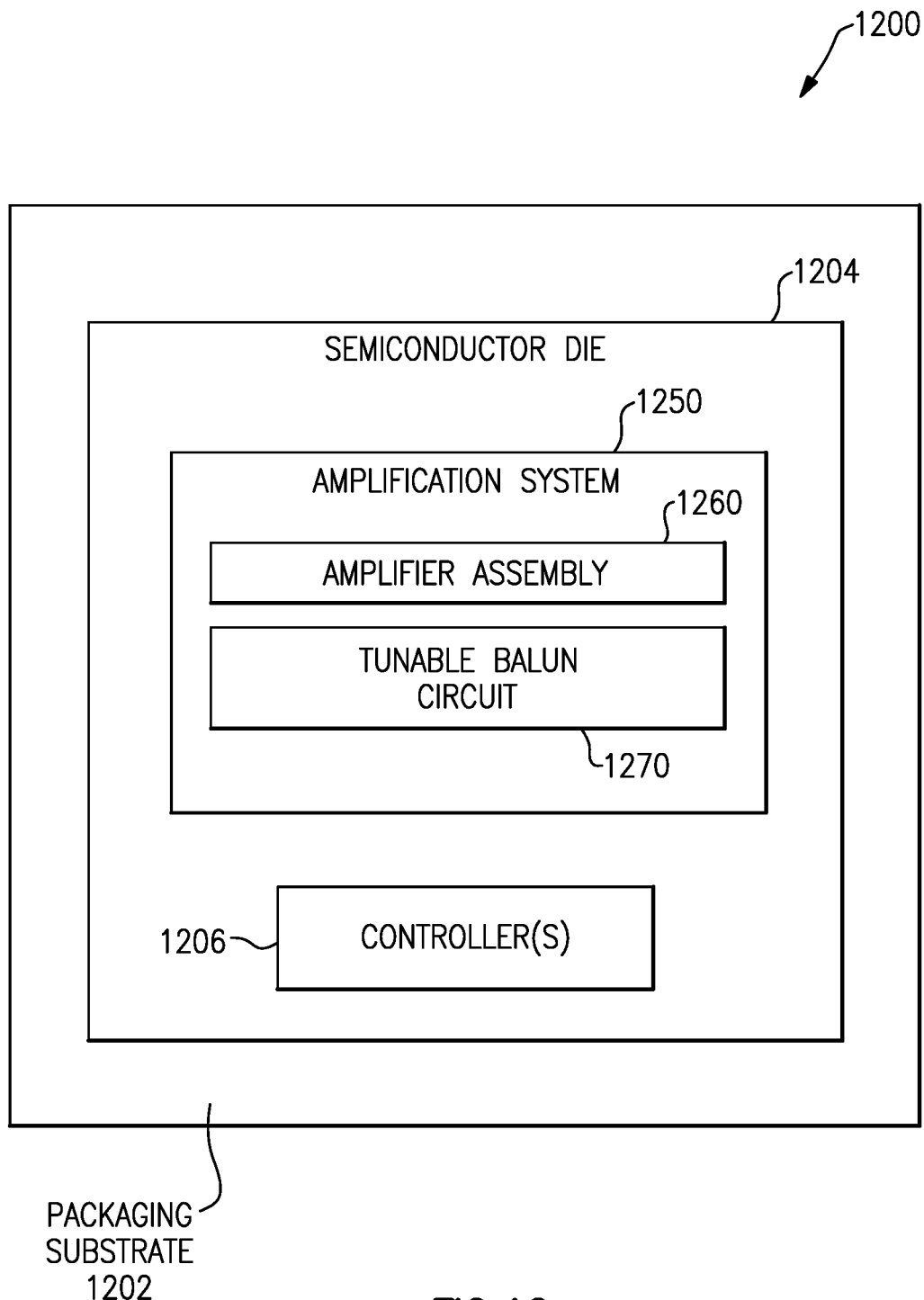
FIG. 12 illustrates an example radio-frequency module in accordance with one or more embodiments.

FIG. 12 illustrates an example radio-frequency module 1200 in accordance with one or more embodiments. The radio-frequency module 1200 includes a packaging substrate 1202, a semiconductor die 1204 mounted on the packaging substrate 1202, an amplification system 1250 implemented on the semiconductor die 1204, and a controller(s) 1206 implemented on the semiconductor die 1204. As shown, the amplification system 1250 includes an amplifier assembly 1260 and a tunable balun circuit 1270. The amplification system 1250 can include any of the amplification systems discussed herein and/or the controller(s) 1206 can include any of the controllers discussed herein. For example, the amplifier assembly 1260 can include any of the amplifier assemblies discussed herein (which can include one or more amplifiers) and/or the tunable balun circuit 1270 can include any of the tunable balun circuits discussed herein. Although the controller(s) 1206 is illustrated as being implemented on the semiconductor die 1204 and the packaging substrate 1202, the controller(s) 1206 can be implemented on a separate semiconductor die and/or packaging substrate. Similarly, the amplifier assembly 1260 and/or the tunable balun circuit 1270 can be implemented on separate semiconductor dies and/or packaging substrates. In embodiments, the radio-frequency module 1200 can be a power amplifier module (PAM), a front-end module (FEM) (which can include a diversity module (e.g., a diversity-receive module) in some examples), and so on.

Figure 13:
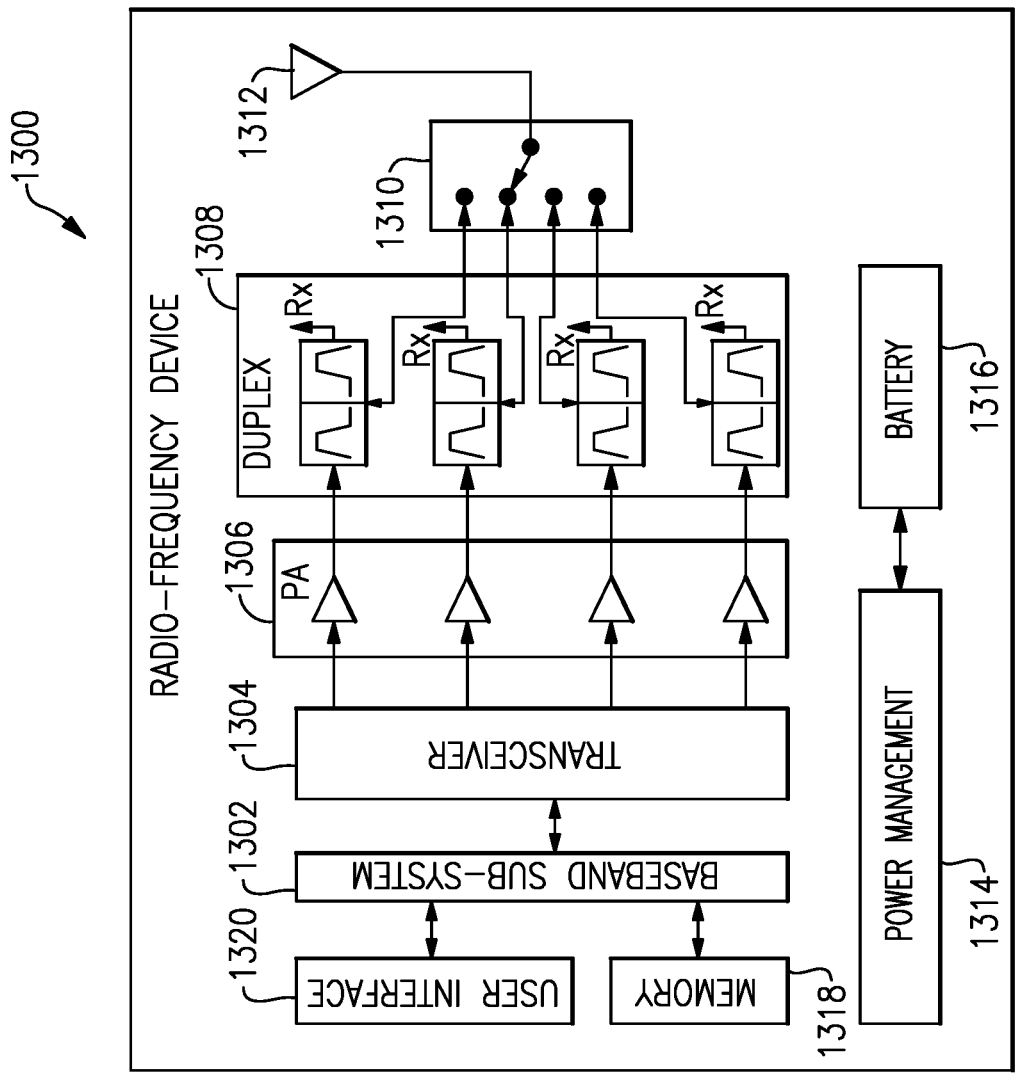
FIG. 13 illustrates an example radio-frequency device in accordance with one or more embodiments.

FIG. 13 illustrates an example radio-frequency device 1300. As shown, the radio-frequency device 1300 can include a baseband sub-system 1302, a transceiver 1304, a power amplifier (PA) module 1306, a duplexer 1308, a switch 1310, one or more antennas 1312, a power management system 1314, a battery 1316, memory 1318, and a user interface component 1320. The baseband sub-system 1302, the transceiver 1304, the PA module 1306, the duplexer 1308, the switch 1310, the one or more antennas 1312, the power management system 1314, the battery 1316, the memory 1318, and/or the user interface component 1320 can be electrically and/or communicatively coupled to each other.

The baseband sub-system 1302 can be connected to the user interface component 1320 to facilitate various input and/or output of voice and/or data provided to and/or received from a user. The baseband sub-system 1302 can also be connected to the memory 1318 that is configured to store data and/or instructions to facilitate operation of the radio-frequency device 1300 and/or to provide storage of information (e.g., for a user, system, etc.).

The transceiver 1304 can generate radio-frequency (RF) signals for transmission and/or process incoming RF signals received from the one or more antennas 1312. The transceiver 1304 can interact with the baseband sub-system 1302 that is configured to provide conversion between data and/or voice signals suitable for a user and/or RF signals suitable for the transceiver 1304. The transceiver 1304 (as well as any other component of the radio-frequency device 1300) can be connected to the power management system 1314.

The PA module 1306 can include a plurality of PAs that can provide an amplified RF signal to the switch 1310 (e.g., via the duplexer 1308). The PA module 1306 can receive an unamplified RF signal from the transceiver 1304. In examples, the duplexer 1308 can allow transmit and/or receive operations to be performed simultaneously using a common antenna. In FIG. 13, received signals are shown to be routed to "Rx" paths that can include, for example, a low-noise amplifier (LNA). In embodiments, any of the amplifiers or amplification systems discussed herein can be implemented within the PA module 1306, an LNA, or another component.

The switch 1310 can route an RF signal to and/or from the one or more antennas 1312. The switch 1310 can include any number of poles and/or throws. In examples, the switch 1310 is implemented on a module. The module can include a packaging substrate configured to receive a plurality of components. Although one switch 1310 is illustrated in the example of FIG. 13, any number of switches can be implemented on the radio-frequency device 1300.

The one or more antennas 1312 can include antennas for transmitting and/or receiving signals associated with a wide variety of frequencies and communications standards. In examples, the one or more antennas 1312 support Multiple-Input Multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity can refer to communications in which a particular antenna is selected for operation at a particular time. For example, a switch can be used to select a particular antenna from a group of antennas based on a variety of factors, such as an observed bit error rate and/or a signal strength indicator. In examples, the one or more antennas 1312 can include a diversity antenna.

The power management system 1314 can be configured to manage power for operation of the radio-frequency device 1300. The power management system 1314 can provide power to any number of components of the radio-frequency device 1300. The power management system 1314 can receive a battery voltage from the battery 1316. The battery 1316 can be any suitable battery for use in the radio-frequency device 1300, including, for example, a lithium-ion battery.

The radio-frequency device 1300 can communicate using a wide variety of communications technologies, including, but not limited to, 2G, 3G, 4G (including Long Term Evolution (LTE), LTE-Advanced, and LTE-Advanced Pro), 5G, Wireless Local Area Network (WLAN) (for instance, Wi-Fi), Wireless Personal Area Network (WPAN) (for instance, Bluetooth and ZigBee), Wireless Metropolitan Area Network (WMAN) (for instance, WiMax), satellite-based radio navigation systems (for instance, Global Positioning System (GPS) technologies), etc.

The radio-frequency device 1300 can operate with beamforming in certain implementations. For example, the radio-frequency device 1300 can include phase shifters having variable phase controlled by the transceiver 1304. Additionally, the phase shifters can be controlled to provide beam formation and directivity for transmission and/or reception of signals using the one or more antennas 1312. For example, in the context of signal transmission, the phases of the transmit signals provided to the one or more antennas 1312 are controlled such that radiated signals from the one or more antennas 1312 combine using constructive and destructive interference to generate an aggregate transmit signal exhibiting beam-like qualities with more signal strength propagating in a given direction. In the context of signal reception, the phases are controlled such that more signal energy is received when the signal is arriving to the one or more antennas 1312 from a particular direction. In embodiments, the one or more antennas 1312 include one or more arrays of antenna elements to enhance beamforming.

In examples, the radio-frequency device 1300 supports carrier aggregation, thereby providing flexibility to increase peak data rates. Carrier aggregation can be used for both Frequency Division Duplexing (FDD) and Time Division Duplexing (TDD) and can be used to aggregate a plurality of carriers or channels. Carrier aggregation includes contiguous aggregation, in which contiguous carriers within the same operating frequency band are aggregated. Carrier aggregation can also be non-contiguous and can include carriers separated in frequency within a common band or in different bands.

The radio-frequency device 1300 can include a wide variety of devices that are configured to communicate wirelessly. For example, the radio-frequency device 1300 can include a cellular phone, a smart-phone, a hand-held wireless device with or without phone functionality, a wireless tablet, a smart appliance, a smart vehicle, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wearable device (e.g., a watch), a clock, etc.

The detailed description is set forth with reference to the accompanying figures. In the figures, the left-most digit(s) of a reference number identifies the figure in which the reference number first appears. The use of the same reference numbers in different figures indicates similar or identical items.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled" can refer to two or more elements that may be either directly connected or connected by way of one or more intermediate elements. Components discussed herein can be coupled in a variety of manners, such as through a conductive material. Additionally, the words "herein," "above," "below," and words of similar import, when used in this disclosure, shall refer to this application as a whole and not to any particular portions of this application. Where the context permits, words in the above Description using the singular or plural number may also include the plural or singular number respectively.

The above description of embodiments of the disclosure is not intended to be exhaustive or to limit the disclosure to the precise form disclosed above. While specific embodiments, and examples, are described above for illustrative purposes, various equivalent modifications are possible within the scope of the disclosure, as those skilled in the relevant art will recognize. For example, while processes or blocks can be presented in a given order, alternative embodiments can perform routines having steps, or employ systems having blocks, in a different order, and some processes or blocks can be deleted, moved, added, subdivided, combined, and/or modified. Each of these processes or blocks can be implemented in a variety of different ways. Also, while processes or blocks are at times shown as being performed in series, these processes or blocks can instead be performed in parallel or can be performed at different times.

The features described herein can be applied to other systems, not necessarily the system described above. The elements and acts of the various embodiments described above can be combined to provide further embodiments.

In embodiments, the methods and/or systems discussed herein can be implemented at least in part by control circuitry and/or memory. For example, memory can store executable instructions that, when executed by control circuitry, cause the control circuitry to perform operations discussed herein. To illustrate, in some embodiments of the process 1000 of FIG. 10, or other processes or architectures discussed herein, a device can include memory and control circuitry, wherein the memory can store executable instructions that, when executed by the control circuitry, cause the control circuitry to perform, at least in part, any of the operations of the process 1000 of FIG. 10. Additionally, or alternatively, other methods and/or systems discussed herein can be implemented at least in part with control circuitry and memory storing executable instructions.

Control circuitry can include one or more processors, such as one or more central processing units (CPUs), one or more microprocessors, one or more graphics processing units (GPUs), one or more digital signal processors (DSPs), and/or other processing circuitry. Alternatively, or additionally, control circuitry can include one or more application specific integrated circuits (ASIC), one or more field-programmable gate arrays (FPGAs), one or more program-specific standard products (ASSPs), one or more complex programmable logic devices (CPLDs), and/or the like. Control circuitry can be configured to execute one or more instructions to thereby perform one or more operations to implement various functionality discussed herein.

Memory can include any suitable or desirable type of computer-readable media. For example, computer-readable media can include one or more volatile data storage devices, non-volatile data storage devices, removable data storage devices, and/or nonremovable data storage devices implemented using any technology, layout, and/or data structure(s)/protocol, including any suitable or desirable computer-readable instructions, data structures, program modules, or other types of data. Computer-readable media that may be implemented in accordance with embodiments of the present disclosure includes, but is not limited to, phase change memory, static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transitory medium that can be used to store information for access by a computing device. As used in certain contexts herein, computer-readable media may not generally include communication media, such as modulated data signals and carrier waves. As such, computer-readable media should generally be understood to refer to non-transitory media.

While some embodiments have been described, these embodiments have been presented by way of example only, and are not intended to limit the scope of the disclosure. Indeed, the methods and systems described herein can be embodied in a variety of other forms; furthermore, various omissions, substitutions and changes in the form of the methods and systems described herein can be made without departing from the spirit of the disclosure. Claims and their equivalents are intended to cover such forms or modifications as would fall within the scope and spirit of the disclosure.

What is claimed is:

1. A variable-gain amplification system comprising:
an amplifier configured to provide an amplified signal and to selectively operate in at least a first gain mode and a second gain mode; and
a tunable circuit including a first coil configured to receive the amplified signal from the amplifier, a second coil configured to provide an output signal, and a first switch coupled between a first portion of the second coil and a second portion of the second coil, the second portion of the second coil including a first end that is coupled to the first switch and a second end that is coupled to a ground, the tunable circuit being configurable to a first turn ratio for the first gain mode and a second turn ratio for the second gain mode.

2. The variable-gain amplification system of claim 1 wherein the tunable circuit includes a second switch coupled to a node located between the first portion of the second coil and the second portion of the second coil.

3. The variable-gain amplification system of claim 2 wherein the second switch is coupled between the node and a ground.

4. The variable-gain amplification system of claim 2 wherein the first portion of the second coil includes a first end that is coupled to an output node and a second end that is coupled to the node.

5. The variable-gain amplification system of claim 1 wherein the amplifier includes a pair of amplifiers configured to generate a pair of amplified signal components and the first coil of the tunable circuit is configured to receive the pair of amplified signal components.

6. The variable-gain amplification system of claim 1 further comprising a first substrate layer, a second substrate layer, and an insulation layer disposed between the first substrate layer and the second substrate layer, the first coil being disposed on the first substrate layer and the second coil being disposed on the second substrate layer.

7. A radio-frequency module comprising:
a packaging substrate;
an amplifier disposed on the packaging substrate, the amplifier being configured to selectively operate in at least a first gain mode and a second gain mode; and
a tunable circuit disposed on the packaging substrate, the tunable circuit being coupled to the amplifier and being configurable to a first turn ratio for the first gain mode and a second turn ratio for the second gain mode, the tunable circuit including a primary coil configured to receive an amplified signal from the amplifier and a secondary coil configured to provide an output signal, the primary coil being disposed on a first substrate layer and the secondary coil being disposed on a second substrate layer, an insulation layer being disposed between the first substrate layer and the second substrate layer.

8. The radio-frequency module of claim 7 wherein the tunable circuit includes a first switch coupled between a first portion of the secondary coil and a second portion of the secondary coil, and a second switch coupled to a node located between the first portion of the secondary coil and the second portion of the secondary coil.

9. The radio-frequency module of claim 8 wherein the amplifier includes a pair of amplifiers configured to generate a pair of amplified signal components and the primary coil of the tunable circuit is configured to receive the pair of amplified signal components.

10. The radio-frequency module of claim 8 wherein the amplifier and the tunable circuit are configured as a Doherty power amplifier.

11. The radio-frequency module of claim 8 wherein the second switch is coupled between the node and a ground.

12. The radio-frequency module of claim 8 wherein the second portion of the secondary coil includes a first end that is coupled to the first switch and a second end that is coupled to a ground.

13. The radio-frequency module of claim 8 wherein the primary coil includes a first end that is coupled to an output node and a second end that is coupled to the node.

14. A radio-frequency device comprising:
an amplifier configured to generate an amplified signal and to selectively operate in at least a first gain mode and a second gain mode;
a tunable circuit including a primary coil configured to receive the amplified signal from the amplifier and a secondary coil configured to provide an output signal, the primary coil being disposed on a first substrate layer and the secondary coil being disposed on a second substrate layer, an insulation layer being disposed between the first substrate layer and the second substrate layer, the tunable circuit being configured to implement a first turn ratio for the first gain mode and a second turn ratio for the second gain mode; and
a controller coupled to the tunable circuit and configured to provide a control signal to the tunable circuit to control a turn ratio state of the tunable circuit.

15. The radio-frequency device of claim 14 wherein the tunable circuit includes a first switch coupled between a first portion of the secondary coil and a second portion of the secondary coil, and a second switch coupled to a node located between the first portion of the secondary coil and the second portion of the secondary coil.

16. The radio-frequency device of claim 15 wherein the amplifier includes a pair of amplifiers configured to generate a pair of amplified signal components and the primary coil of the tunable circuit is configured to receive the pair of amplified signal components.

17. The radio-frequency device of claim 15 wherein the second switch is coupled between the node and a ground.

18. The radio-frequency device of claim 15 wherein the primary coil includes a first end that is coupled to an output node and a second end that is coupled to the node.

* * * * *